United States Patent
Noda et al.

(10) Patent No.: US 10,461,502 B2
(45) Date of Patent: Oct. 29, 2019

(54) TWO-DIMENSIONAL PHOTONIC CRYSTAL SURFACE EMITTING LASER AND METHOD OF MANUFACTURING THE SAME

(71) Applicants: KYOTO UNIVERSITY, Kyoto-shi, Kyoto (JP); ROHM CO., LTD., Kyoto-shi, Kyoto (JP); HAMAMATSU PHOTONICS K.K., Hamamatsu-shi, Shizuoka (JP); MITSUBISHI ELECTRIC CORPORATION, Tokyo (JP)

(72) Inventors: Susumu Noda, Kyoto (JP); Yoshinori Tanaka, Kyoto (JP); Menaka De Zoysa, Kyoto (JP)

(73) Assignees: KYOTO UNIVERSITY, Kyoto (JP); ROHM CO., LTD., Kyoto (JP); HAMAMATSU PHOTONICS K.K., Hamamatsu (JP); MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/080,480

(22) PCT Filed: Feb. 24, 2017

(86) PCT No.: PCT/JP2017/007184
§ 371 (c)(1),
(2) Date: Aug. 28, 2018

(87) PCT Pub. No.: WO2017/150387
PCT Pub. Date: Sep. 8, 2017

(65) Prior Publication Data
US 2019/0067907 A1    Feb. 28, 2019

(30) Foreign Application Priority Data
Feb. 29, 2016 (JP) .................. 2016-037876

(51) Int. Cl.
*H01S 5/00* (2006.01)
*H01S 5/10* (2006.01)
(Continued)

(52) U.S. Cl.
CPC ............ *H01S 5/105* (2013.01); *H01S 5/0425* (2013.01); *H01S 5/18* (2013.01); *H01S 5/183* (2013.01);
(Continued)

(58) Field of Classification Search
CPC ........ H01S 5/105; H01S 5/0425; H01S 5/183; H01S 5/3432; H01S 5/18; H01S 5/34313; H01S 5/324; H01S 5/204; H01S 2301/17
See application file for complete search history.

(56) References Cited

U.S. PATENT DOCUMENTS

2006/0245464 A1\* 11/2006 Hori .................. H01S 5/183
372/99
2007/0036189 A1\* 2/2007 Hori .................. H01S 5/183
372/50.11
(Continued)

FOREIGN PATENT DOCUMENTS

CA    2 521 005 A1    10/2004
CA    2 558 225 A1    9/2005
(Continued)

OTHER PUBLICATIONS

May 9, 2017 International Search Report issued in International Patent Application No. PCT/JP2017/007184.
(Continued)

*Primary Examiner* — Kinam Park
(74) *Attorney, Agent, or Firm* — Oliff PLC

(57) ABSTRACT

A two-dimensional photonic crystal surface emitting laser has, in a plate-shaped base body, a two-dimensional photonic crystal layer in which modified refractive index region
(Continued)

pairs are periodically arranged and an active layer provided on one side of the base body, each of the modified refractive index region pairs including a first modified refractive index region and a second modified refractive index region having refractive indexes different from a refractive index of the base body, wherein an area of a planar shape of the first modified refractive index region is larger than or equal to an area of a planar shape of the second modified refractive index region, and a thickness of the first modified refractive index region is smaller than a thickness of the second modified refractive index region.

16 Claims, 13 Drawing Sheets

(51) Int. Cl.
| | | |
|---|---|---|
| H01S 5/18 | (2006.01) | |
| H01S 5/20 | (2006.01) | |
| H01S 5/183 | (2006.01) | |
| H01S 5/042 | (2006.01) | |
| H01S 5/343 | (2006.01) | |
| H01S 5/323 | (2006.01) | |

(52) U.S. Cl.
CPC ............ *H01S 5/204* (2013.01); *H01S 5/3432* (2013.01); *H01S 5/323* (2013.01); *H01S 5/34313* (2013.01); *H01S 2301/17* (2013.01)

(56) References Cited

U.S. PATENT DOCUMENTS

| | | |
|---|---|---|
| 2007/0075318 A1 | 4/2007 | Noda et al. |
| 2007/0177647 A1 | 8/2007 | Noda et al. |
| 2008/0240179 A1* | 10/2008 | Otsuka ............ H01S 5/18 372/26 |
| 2008/0273832 A1* | 11/2008 | Kiyota ............ B82Y 20/00 385/14 |
| 2009/0135869 A1* | 5/2009 | Noda ............ H01S 5/105 372/41 |
| 2016/0020580 A1* | 1/2016 | Takiguchi ............ H01S 5/105 372/44.011 |

FOREIGN PATENT DOCUMENTS

| | | |
|---|---|---|
| CN | 1926730 A | 3/2007 |
| CN | 101258653 A | 9/2008 |
| EP | 1 610 427 A1 | 12/2005 |
| EP | 1 724 887 A1 | 11/2006 |
| EP | 1 933 431 A1 | 6/2008 |
| JP | 2004-296538 A | 10/2004 |
| JP | 2007-180120 A | 7/2007 |
| JP | 2008-243962 A | 10/2008 |
| JP | 4820749 B2 | 11/2011 |
| JP | 2012-134259 A | 7/2012 |
| KR | 2005-0111362 A | 11/2005 |
| KR | 2007-0006826 A | 1/2007 |
| KR | 2008-0049734 A | 6/2008 |
| WO | 2004/86575 A1 | 10/2004 |
| WO | 2005/086302 A1 | 9/2005 |
| WO | 2007/029661 A1 | 3/2007 |

OTHER PUBLICATIONS

May 9, 2017 Written Opinion issued in International Patent Application No. PCT/JP2017/007184.

* cited by examiner (a)

(b)

(a) CROSS SECTION 1      (b) CROSS SECTION 2

(a) UPPER SURFACE (b) LONGITUDINAL CROSS SECTION

TWO-DIMENSIONAL PHOTONIC CRYSTAL SURFACE EMITTING LASER AND METHOD OF MANUFACTURING THE SAME

TECHNICAL FIELD

The present invention relates to a semiconductor laser, and more particularly to a two-dimensional photonic crystal surface emitting laser for amplifying light by using a two-dimensional photonic crystal and a method of manufacturing the two-dimensional photonic crystal surface emitting laser.

BACKGROUND ART

Semiconductor lasers have many advantages such as a small size, a low price, low power consumption, and a long life. Due to those advantages, the semiconductor lasers have been widely used in a wide range of fields such as light sources for optical recording, light sources for communication, laser displays, laser printers, and laser pointers. In the field of laser machining, a laser having an optical output exceeding at least 1 W is required. However, none of the semiconductor lasers currently in practical use has reached this output for the reasons described below. Consequently, in the current situation, instead of semiconductor lasers, gas lasers such as carbon dioxide lasers have been used in the field of laser machining.

The reason for the small light output in the semiconductor laser currently in practical use is as follows. In order to increase the light output of the semiconductor laser, it is preferable that the cross-sectional area (emission area) of the laser beam emitted from an element is large. On the other hand, in order to increase the machining accuracy, it is preferable that the cross-sectional area (spot area) of the laser beam irradiated to a workpiece is small. Therefore, ideally, it is desired that the laser beam emitted from the laser source reaches the workpiece as it is without spreading. However, in the semiconductor lasers, as the emission area is increased, laser oscillation occurs in many modes, resulting in disturbed wave front of the laser light. With the disturbed wave front of the laser light, it is difficult to reduce the spot area even if the light is condensed by using an optical system. For this reason, it is difficult for the semiconductor laser currently in practical use to obtain a high light output while reducing the spot area.

Patent Literature 1 discloses a two-dimensional photonic crystal surface emitting laser which is one type of a semiconductor laser. The two-dimensional photonic crystal surface emitting laser is configured to include a two-dimensional photonic crystal and an active layer, where, in the two-dimensional photonic crystal, modified refractive index regions having refractive indexes different from that of a plate-shaped base body are periodically arranged. The modified refractive index region is typically made by holes formed in the base body. In the two-dimensional photonic crystal surface emitting laser, only the light of a predetermined wavelength corresponding to the period of the modified refractive index region among the light generated in the active layer by the injection of the current into the active layer is amplified so that the laser oscillation occurs and emerges as a laser beam in the direction perpendicular to the two-dimensional photonic crystal. Since the two-dimensional photonic crystal surface emitting laser emits light (surface emission) from an area within a certain range in the two-dimensional photonic crystal, the emission area is larger than that of an edge emitting type semiconductor laser, whereby the output power of the light can be easily increased and the divergence angle can be reduced.

Various types of two-dimensional photonic crystals having different shapes and arrangements of modified refractive index regions have been known. The two-dimensional photonic crystal of the two-dimensional photonic crystal surface emitting laser disclosed in Patent Literature 1 has a configuration where, at positions slightly dislocated from each of the modified refractive index regions (main modified refractive index regions) arranged in a square lattice pattern with a period "a", subsidiary modified refractive index regions of which planar area is smaller than that of the main modified refractive index region are provided. The combination of the main modified refractive index region and the subsidiary modified refractive index region is referred to as a "modified refractive index region pair".

According to the configuration of Patent Literature 1, in a case where the distance $d_x$ in the x direction and the distance $d_y$ in the y direction of the subsidiary modified refractive index region from the main modified refractive index region are both 0.25a, in the two-dimensional photonic crystal, among light having the wavelength λ of "a", the light whose propagation direction is changed by 180° due to reflection at the main modified refractive index region and the light whose propagation direction is changed by 180° due to reflection at the subsidiary modified refractive index region have a difference of 0.5λ in the optical path length, and thus, the two lights are weakened by interference. On the other hand, the light whose propagation direction is changed by 90° in the main modified refractive index region and the light whose propagation direction is changed by 90° in the subsidiary modified refractive index region have a difference of 0.25λ in the optical path length, and thus, the two lights may not be weakened by interference. Since the lights whose propagation direction is changed by 90° in the modified refractive index region pair have a difference of λ in the optical path length with respect to light whose propagation direction is changed in the same direction in the modified refractive index region pair adjacent in the x direction or in the y direction, the lights can be strengthened by interference. The reflection of the light in the direction of 180° causes the localization of light in a partial region in the two-dimensional photonic crystal due to the repetition of this reflection. On the other hand, the change of the propagation direction of the light by 90° contributes to surface emission in a wide range in the two-dimensional photonic crystal. Therefore, by adopting the above configuration, it is possible to strengthen the light in a wide range in the two-dimensional photonic crystal while suppressing the localization of light in a partial region in the two-dimensional photonic crystal, so that it is possible to increase the output power of the laser light.

CITATION LIST

Patent Literature

Patent Literature 1: JP 2008-243962 A
Patent Literature 2: JP 2007-180120 A

SUMMARY OF INVENTION

Technical Problem

In the two-dimensional photonic crystal surface emitting laser disclosed in Patent Literature 1, in the case of increasing the output power of the laser light by the effect of interference by the modified refractive index region pair as described above, in order to maximize the effect, it is necessary to sufficiently analyze the relationship between the main modified refractive index region and the subsidiary modified refractive index region in each of the modified refractive index region pairs.

The problem to be solved by the present invention is to provide, as a two-dimensional photonic crystal surface emitting laser using a modified refractive index region pair, a two-dimensional photonic crystal surface emitting laser capable of obtaining a laser light having a larger output power by further enhancing interference effect in a modified refractive index region pair as well as and a method of manufacturing the two-dimensional photonic crystal surface emitting laser.

Solution to Problem

The present inventors have analyzed in detail the effect of interference by the main modified refractive index region and the subsidiary modified refractive index region in the two-dimensional photonic crystal surface emitting laser having the modified refractive index region pair disclosed in Patent Literature 1. As a result, it is found that the manner of reflection in each of the main modified refractive index region and the subsidiary modified refractive index region together with the distance between them is important in the interference due to reflections of lights at the two modified refractive index regions. That is, in the modified refractive index region pair described in Patent Literature 1, the area of the planar shape of the subsidiary modified refractive index region is smaller than the area of the planar shape of the main modified refractive index region, and the manner of reflection of lights at the two regions is unbalanced.

In addition, according to a dry etching method generally used at the time of manufacturing a two-dimensional photonic crystal, since an etching gas hardly intrudes into holes as the planar shape of the holes (modified refractive index regions) is smaller, the etching speed is lowered, and the thickness becomes naturally small (the depth becomes shallow). Therefore, the thickness of the subsidiary modified refractive index region having a planar shape smaller than that of the main modified refractive index region is smaller than that of the main modified refractive index region (refer to Patent Literature 2). As a result, the main modified refractive index region and the subsidiary modified refractive index region have a difference in volume which is larger than the difference in area of the planar shapes. For this reason, with respect to a surface emitting laser using a two-dimensional photonic crystal having the structure described in Patent Literature 1, in actual products, the reflection of light at the main modified refractive index region and at the subsidiary modified refractive index region are further unbalanced, so that it is not possible to obtain a high power output of laser emission using a sufficient interference effect.

In order to solve the above problems, according to the present invention, there is provided a two-dimensional photonic crystal surface emitting laser having, in a plate-shaped base body, a two-dimensional photonic crystal in which modified refractive index region pairs are periodically arranged and an active layer provided on one side of the base body, each of the modified refractive index region pairs including a first modified refractive index region and a second modified refractive index region having refractive indexes different from the refractive index of the base body, wherein the area of the planar shape of the first modified refractive index region is larger than or equal to the area of the planar shape of the second modified refractive index region, and wherein the thickness of the first modified refractive index region is smaller than the thickness of the second modified refractive index region.

According to the two-dimensional photonic crystal surface emitting laser according to the present invention, the area of the planar shape of the first modified refractive index region is larger than or equal to the area of the planar shape of the second modified refractive index region. Therefore, it is easy to set the area and thickness so that volumes of the first modified refractive index region and the second modified refractive index region are close to each other. Since the volumes of the first modified refractive index region and the second modified refractive index region are made to be close to each other, the difference in intensity between the light whose propagation direction is changed at the main modified refractive index region and the light whose propagation direction is changed at the subsidiary modified refractive index region, so that it is possible to increase the effect of interference of the lights. It is preferable that the ratio $V_1/V_2$ of the volume $V_1$ of the first modified refractive index region to the volume $V_2$ Of the second modified refractive index region is 0.25 to 4.0.

In the two-dimensional photonic crystal surface emitting laser according to the present invention, it is preferable that the modified refractive index region pair is arranged in a square lattice pattern having the period length "a" in the x direction parallel to the base body and the period length "a" in the y direction parallel to the base body and perpendicular to the x direction, and the center of gravity of the first modified refractive index region and the center of gravity of the second modified refractive index region are arranged to be shifted from each other by 0.15a to 0.35a in the x direction and by 0.15a to 0.35a in the y direction. The magnitude of the shift in the x direction and the y direction is more preferably 0.23a to 0.28a, and most preferably 0.25a.

By arranging the first modified refractive index region and the second modified refractive index region to be shifted by the above-mentioned magnitude, the light whose propagation direction is changed by 180° due to reflection at the first modified refractive index region and the light whose propagation direction is changed by 180° due to reflection at the second modified refractive index region are weakened by interference, so that light is prevented from being localized in a partial region in the two-dimensional photonic crystal. Therefore, in the wide range in the two-dimensional photonic crystal, the light whose propagation direction is changed by 90° at the first modified refractive index region and at the second modified refractive index region is strengthened by interference, so that the output power of the two-dimensional photonic crystal surface emitting layer can be further increased.

In the present invention, the magnitude of the shift between the center of gravity of the first modified refractive index region and the center of gravity of the second modified refractive index region in the x direction and the y direction is not limited to 0.15a to 0.35a described above. For example, it is possible to obtain a two-dimensional photonic crystal surface emitting laser having various effects by interference according to the magnitude of the shift such as generation of the laser light which is locally strengthened due to localization of light by interference in the two-dimensional photonic crystal, and adjustment of the intensity of radiation in the vertical direction of the plane.

In addition, regardless of the magnitude of the shift of the centers of gravity of the two modified refractive index regions in the x direction and the y direction, in the calculation performed when designing the two-dimensional photonic crystal layer, while changing the areas and thickness of the two modified refractive index regions, the vibration mode of light in the two-dimensional photonic crystal layer is changed, and the energy gain difference between the fundamental vibration mode and the higher-order vibration mode is also changed. As the energy gain difference is increased, the two-dimensional photonic crystal surface emitting laser stably oscillates in the single vibration mode. As described above, according to the present invention, the flexibility in designing the two-dimensional photonic crystal surface emitting laser capable of obtaining stable laser oscillation is increased. Furthermore, by obtaining stable laser oscillation in this manner, it is possible to increase the area of the two-dimensional photonic crystal, so that the intensity of the laser can be increased.

The planar shape of either one or both of the first modified refractive index region and the second modified refractive index region is more easily manufactured than the modified refractive index region having a more complicated shape that an equilateral triangle (particularly, in the case of hole), so that the planar shape is preferably circular. In addition, since the circular modified refractive index region has no pointed portion, there is an advantage in that it is easy to increase the distance from the adjacent modified refractive index region. Another advantage is that the circular modified refractive index region may not be unintentionally connected to the adjacent modified refractive index region.

The shape of the region having the refractive index different from that of the base body formed by the modified refractive index region pair has a larger dimension in the direction of the straight line connecting the centers of gravity of the two modified refractive index regions. Then, among the light propagating in the direction inclined with respect to the straight line in the two-dimensional photonic crystal, with respect to the light whose propagation direction is changed by +90° and the light whose propagation direction is changed by −90° at the modified refractive index region pair, the intensity of any one side becomes weaker than that of the other side, and the effect of strengthening the light by interference is weakened. Therefore, it is preferable that one or both of the first modified refractive index region and the second modified refractive index region have an elliptical planar shape, and the major axis of the elliptical shape is arranged so as to be in the direction within a range of 45° to 135° with respect to the straight line connecting the center of gravity of the first modified refractive index region and the center of gravity of the second modified refractive index region. As a result, the dimension in the direction of the straight line of the area having refractive index different from that of the base body is prevented from becoming large, and the effect of strengthening the light by interference can be prevented from being weakened. The same effect can be obtained by using a rectangular modified refractive index region instead of the elliptical shape and arranging the long side so as to be in the direction within a range of 45° to 135° with respect to the straight line.

Furthermore, the effect of preventing the weakening of the effect of strengthening the light by interference as described above can also be achieved by a non-circular modified refractive index region other than an elliptical shape or a rectangular shape. That is, it is preferable that one or both of the first modified refractive index region and the second modified refractive index region has a non-circular planar shape, and a reference axis (described in detail later) is arranged so as to be in a direction within a range of 45° to 135° with respect to a straight line connecting the center of gravity of the first modified refractive index region and the center of gravity of the second modified refractive index region, the reference axis being defined by a straight line having a smaller second moment of area out of two straight lines which are perpendicular at the center of gravity in the planar shape and are determined so that the product of inertia of area is 0.

The reference axis is defined as follows. First, in the planar shape of the modified refractive index region, its center of gravity is set as the origin, and the x axis and the y axis which are perpendicular to each other are determined so that a product of inertia of area $I_{xy}$ obtained by surface-integrating a product XY of the distance Y from the x axis and the distance X from the y axis of the minute area element dS in the planar shape is 0.

$$I_{xy} = \iint X \cdot Y \, dS \ldots \quad (1)$$

Next, the second moment of area $I_x$ with respect to the x axis obtained by surface integration of the square of the distance Y and the second moment of area $I_y$ with respect to the y axis obtained by surface integration of the square of the distance X are obtained.

$$I_x = \iint Y^2 \, dS \ldots \quad (2)$$

$$I_y = \iint X^2 \, dS \ldots \quad (3)$$

If $I_x < I_y$, the x axis is defined as the reference axis. If $I_x > I_y$, the y axis is defined as the reference axis. For example, in a case where the planar shape is an ellipse, the major axis is the reference axis. In a case where the planar shape is a rectangle, a straight line that is parallel to the long side and passes through the center of gravity is the reference axis. In addition, generally, of the above two axes, the axis having the larger second moment of area is called a "strong axis", and the axis with the smaller second moment of area is called a "weak axis".

In the case of using such a non-circular modified refractive index region, it is preferable that one of the first modified refractive index region and the second modified refractive index region has a non-circular shape, and the other has a circular shape. As a result, asymmetry occurs in the electric field generated around the modified refractive index region pair, and thus, the intensity of the electric field due to the interference is prevented from being decreased, so that the intensity of the light can be increased.

The two-dimensional photonic crystal surface emitting laser according to the present invention can be suitably manufactured by the following method. According to the present invention, there is provided a method for manufacturing a two-dimensional photonic crystal surface emitting laser having, in a plate-shaped base body, a two-dimensional photonic crystal in which modified refractive index region pairs are periodically arranged and an active layer provided on one side of the base body, each of the modified refractive index region pairs including a first modified refractive index region and a second modified refractive index region having refractive indexes different from the refractive index of the base body, the method including: a lower mask layer producing step of producing a lower mask layer on the base body; a first upper mask forming step of forming, on the lower mask layer, a first upper mask in which hole pairs including a first hole and a second hole are provided at the same period as the modified refractive index region pair; a first etching step of etching the lower mask layer and the base body down to a predetermined first depth at maximum through the first hole and the second hole; a first upper mask removing step of removing the first upper mask; a second upper mask forming step of forming, on the lower mask layer, a second upper mask which has a hole larger than one of the first hole and the second hole provided at a position corresponding to the one and which is closed at a position corresponding to the other; a second etching step of etching the base body down to a predetermined second depth through the hole of the second upper mask; a second upper mask removing step of removing the second upper mask; and a lower mask layer removing step of removing the lower mask layer.

According to the method of manufacturing the two-dimensional photonic crystal surface emitting laser according to the present invention, in the first upper mask forming step, the first upper mask having the first hole and the second hole is formed on the lower mask layer (at this time, there is no hole formed in the lower mask layer). In addition, in the first etching step, the lower mask layer and the base body are etched down to the first predetermined depth at maximum through the first hole and the second hole, so that two holes corresponding to the two modified refractive index regions of the modified refractive index region pair are formed at the same period as the modified refractive index region pairs. Herein, in a case where the areas of the first hole and the second hole are different, since an etchant is easily to intrude into the hole having a larger area among the two holes, so that etching is performed down to a maximum depth, that is, down to a first depth from the hole, and etching is performed down to a position shallower than the first depth from the other hole. Subsequently, the second upper mask which has a hole larger than one of the first hole and the second hole provided at a position corresponding to the one and which is closed at a position corresponding to the other is formed, and then, the base body is etched down to a predetermined second depth through the hole of the second upper mask. As a result, only one of the two holes corresponding to the two modified refractive index regions of the modified refractive index region pair can be etched deeper. In this case, even if the positions of the first hole or the second hole of the first upper mask and the hole of the second upper mask are somewhat shifted, in the portion common to the two holes, the base body can be etched down to a predetermined second depth. On the other hand, if there occurs a shift in the positions of the first upper mask and the second upper mask, the etchant passes through the hole of the second upper mask in the second etching step even in the portion not etched in the first etching process. However, in this portion, only the lower mask layer is etched, and thus, the base body can be etched only at the same position as the first etching process.

In the method for manufacturing a two-dimensional photonic crystal surface emitting laser according to the present invention, by adopting a configuration where the first hole is larger in area than the second hole and the hole of the second upper mask is provided at a position corresponding to the second hole, it is possible to form a modified refractive index region pair in which the planer shape of the first modified refractive index region is larger in area than the planar shape of the second modified refractive index region and the thickness of the first modified refractive index region is smaller than the thickness of the second modified refractive index region. In addition, in a case where the areas of the first hole and the second hole are the same, a modified refractive index region pair having the same planar shape and different thicknesses can be formed. In any of these cases, the two-dimensional photonic crystal surface emitting laser according to the present invention can be manufactured by the manufacturing method.

In addition, by adopting a configuration where the first hole is larger in area than the second hole and the hole in the second upper mask is provided at a position corresponding to the first hole, similarly to the two-dimensional photonic crystal surface emitting laser disclosed in Patent Literature 1, it is possible to form a modified refractive index region pair in which the planer shape of the first modified refractive index region is larger in area than the planar shape of the second modified refractive index region and the thickness of the first modified refractive index region is larger than the thickness of the second modified refractive index region. In this case, the thickness of the first modified refractive index region, which is larger in area than the second modified refractive index region, becomes much larger in thickness than that of a case where the region is manufactured by the method described in Patent Literature 1.

Advantageous Effects of the Invention

According to the present invention, it is possible to further enhance an interference effect in a modified refractive index region pair and to obtain laser light with a larger output power.

DESCRIPTION OF EMBODIMENTS

Figure 1:
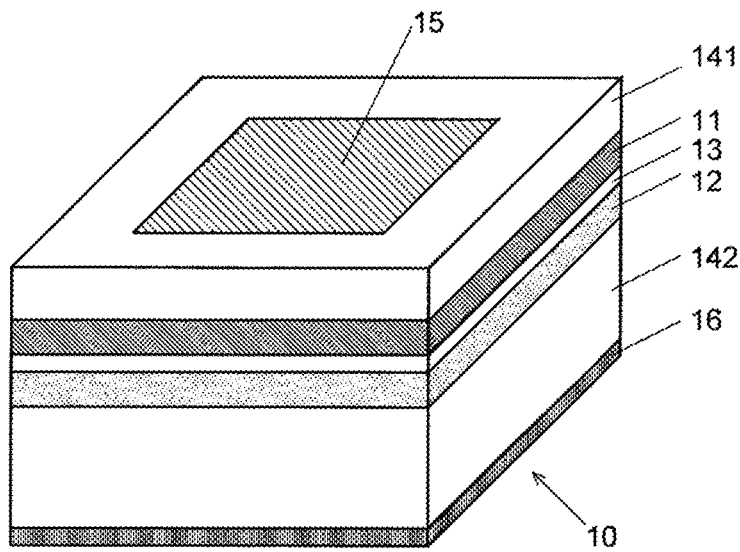
FIG. 1 is a perspective view illustrating two examples of an entire structure in a two-dimensional photonic crystal surface emitting laser according to an embodiment of the present invention.
Figure 1:
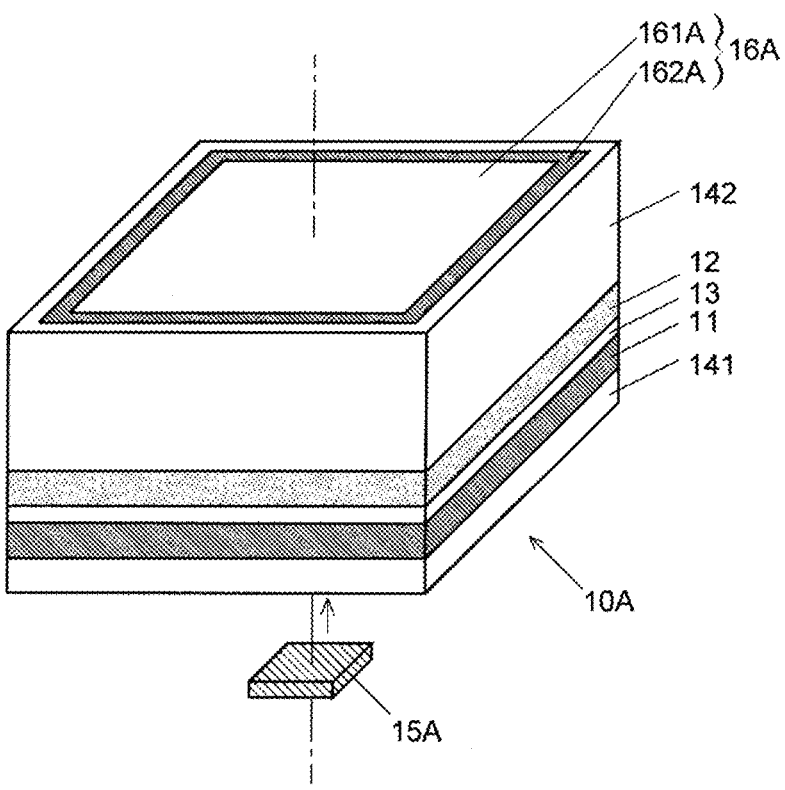

An embodiment of a two-dimensional photonic crystal surface emitting laser according to the present invention will be described with reference to FIGS. 1 to 19.

(1) Configuration of Two-Dimensional Photonic Crystal Surface Emitting Laser According to the Present Embodiment As illustrated in FIG. 1(a), the two-dimensional photonic crystal surface emitting laser 10 according to this embodiment is configured to include a first electrode 15, a first cladding layer 141, an active layer 11, a spacer layer 13, a two-dimensional photonic crystal layer 12, a second cladding layer 142, and a second electrode 16, which are stacked in this order. However, the order of the active layer 11 and the two-dimensional photonic crystal layer 12 may be reversed from those described above. In FIG. 1(a), for the convenience, the first electrode 15 is illustrated as an upper side, and the second electrode 16 is illustrated as a lower side. However, the orientation of the two-dimensional photonic crystal surface emitting laser 10 during the use is not limited to the orientation illustrated in this figure. Hereinafter, configurations of each layer and each electrode will be described. In the following description, first, the configurations other than the two-dimensional photonic crystal layer 12 are described, and after that, the configuration of the two-dimensional photonic crystal layer 12 will be described in detail.

The active layer 11 is injected with charges from the first electrode 15 and the second electrode 16 to emit light having a predetermined wavelength band. In this embodiment, the material of the active layer 11 is an InGaAs/AlGaAs multiple quantum well (emission wavelength band: 935 to 945 nm). However, the present invention is not limited to this material. A thickness of the active layer 11 is about 50 to 100 nm.

The spacer layer 13 is not an essential component in the present invention, but is provided to connect the active layer 11 and the two-dimensional photonic crystal layer 12, which are made of different materials. The material of the spacer layer 13 is AlGaAs in this embodiment. However, the material of the spacer layer 13 is appropriately changed depending on the materials of the active layer 11 and the two-dimensional photonic crystal layer 12.

Although the first cladding layer 141 and the second cladding layer 142 are not essential components in the present invention but have functions of connecting the first electrode 15 with the active layer 11, connecting the second electrode 16 with the two-dimensional photonic crystal layer 12, and facilitating injection of current from the first electrode 15 and the second electrode 16 into the active layer 11. In order to fulfill these functions, a p-type semiconductor is used as a material of the first cladding layer 141, and an n-type semiconductor is used as a material of the second cladding layer 142. The first cladding layer 141 has a two-layer structure including a layer made of p-GaAs and a layer made of p-AlGaAs in this order from the first electrode 15 side. Similarly, the second cladding layer 142 has a two-layer structure including a layer made of n-GaAs and a layer made of n-AlGaAs in this order from the second electrode 16 side (these two-layer structures are not illustrated). The materials of the first cladding layer 141 and the second cladding layer 142 in the present invention are not limited to the above-mentioned materials. The planar dimensions of the first cladding layer 141 and the second cladding layer 142 are the same as those of the active layer 11 and the base body 121 of the two-dimensional photonic crystal layer 12. The thickness of the first cladding layer 141 is 2 μm, and the thickness of the second cladding layer 142 is 200 μm. However, the present invention is not limited to these values.

The first electrode 15 has a square shape having a one-side length L of about 200 μm and is smaller than a region where the two-dimensional photonic crystal is formed in the active layer 11 and the two-dimensional photonic crystal layer 12. In addition, a reflective layer (not illustrated) made of a metal opaque to the laser light is provided around the first electrode 15 with an insulator interposed between the reflective layer and the first electrode 15. The reflective layer has a function of reflecting the laser be light am generated inside the two-dimensional photonic crystal surface emitting laser 10 together with the first electrode 15 and emitting the laser light from the second electrode 16 side to the outside.

In this embodiment, the second electrode 16 is formed with indium tin oxide (ITO) which is an n-type semiconductor and transparent to the laser light. However, the present invention is limited to this material, and for example, indium zinc oxide (IZO) may also be used. The second electrode 16 has a square shape having a one-side length of about 800 μm and has a planar dimension that is equal to or slightly smaller than that of the active layer 11 and the base body 121 of the two-dimensional photonic crystal layer 12 described below.

In this embodiment, instead of the second electrode 16 made of the above-described transparent electrode, a second electrode 16A illustrated in FIG. 1(b) may be used. In FIG. 1(b), the upside and downside are illustrated to be inverted as compared with FIG. 1(a). The second electrode 16A has a configuration where a center of a square plate-shaped member made of a metal opaque to the laser light is cut out. The cut-out portion of the plate-shaped member is referred to as a window portion 161A, and the remaining portion of the plate-shaped member is referred to as a frame portion 162A. The square shape of the plate-shaped member (outer side of the frame portion 162A) has a one-side length of 800 μm, and the square shape of the window portion 161A has a one-side length of 600 μm. In this case, for the first electrode 15A, a square plate-shaped member having a square shape having a one-side length of 200 μm which is smaller than the square plate-shaped member of the second electrode 16A is used.

The dimensions of the respective components described above are merely examples, and the present invention is not limited to these dimensions.

As illustrated in FIG. 2(a), the two-dimensional photonic crystal layer 12 is formed by arranging modified refractive index region pairs 122 having a refractive index different from that of the plate-shaped base body 121 in a square lattice pattern in the plate-shaped base body 121. The modified refractive index region pairs 122 are arranged within a square region (hereinafter, referred to as a "photonic crystal region") of the base body 121, and the inside of the photonic crystal region functions as a photonic crystal. The size of the photonic crystal region is equal to or slightly larger than that of the second electrode 16 or 16A. In addition, the photonic crystal region may have a shape such as a circular shape or a hexagonal shape other than a square shape. The period length "a" of the square lattice is set to 287 nm corresponding to a wavelength within an emission wavelength band of the active layer 11 by taking into consideration the refractive index of the inside of the photonic crystal region. The material of the base body 121 is GaAs, the planar dimensions thereof are the same as those of the active layer 11 and the like, and the thickness thereof is about 300 nm. The period length "a" and the thickness may be appropriately changed depending on the emission wavelength band of the active layer 11.

The modified refractive index region pair 122 includes a first modified refractive index region 1221 and a second modified refractive index region 1222. Both of the first modified refractive index region 1221 and the second modified refractive index region 1222 are cylindrical holes formed in the base body 121. The first modified refractive index region 1221 is larger than the second modified refractive index region 1222 in area of the planar circle and is smaller in thickness (FIG. 2(b)). For example, the first modified refractive index region 1221 is set to have a radius of the planar circle of 39.6 nm (area of 4940 nm$^2$) and a thickness of 165 nm, and the second modified refractive index region 1222 is set to have a radius of the planar circle of 32.4 nm (area of 3290 nm$^2$) and a thickness of 200 nm. The center of gravity of the first modified refractive index region 1221 and the center of gravity of the second modified refractive index region 1222 in one modified refractive index region pair 122 are arranged to be shifted by 0.25a in the x direction and 0.25a in the y direction. These shifts in both of the x direction and the y direction may be within a range of 0.15a to 0.35a (refer to Patent Literature 1).

Figure 2:
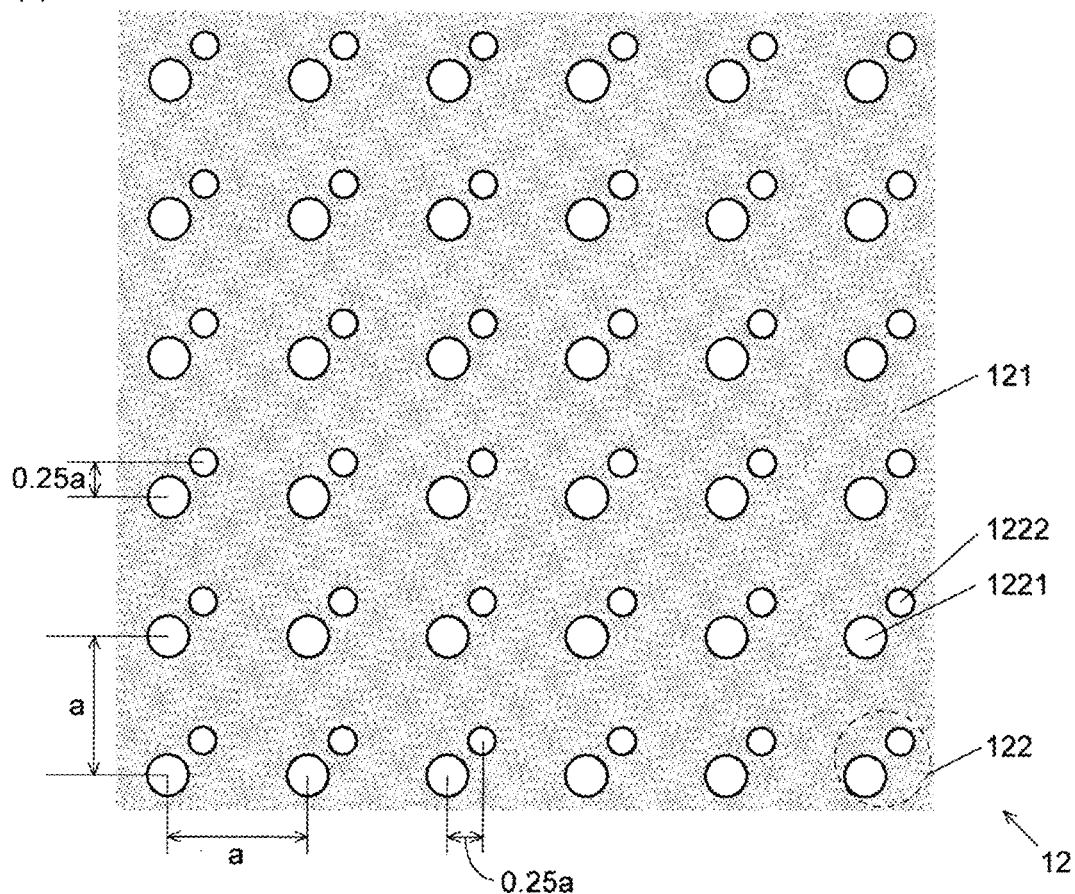
FIG. 2 is a plan view (a) and a longitudinal cross-sectional view (b) of a two-dimensional photonic crystal in the two-dimensional photonic crystal surface emitting laser according to the present invention.
Figure 2:
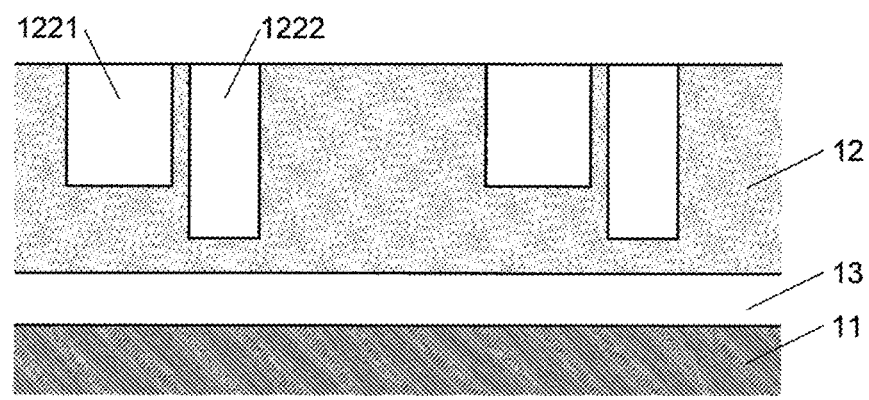
Figure 3:
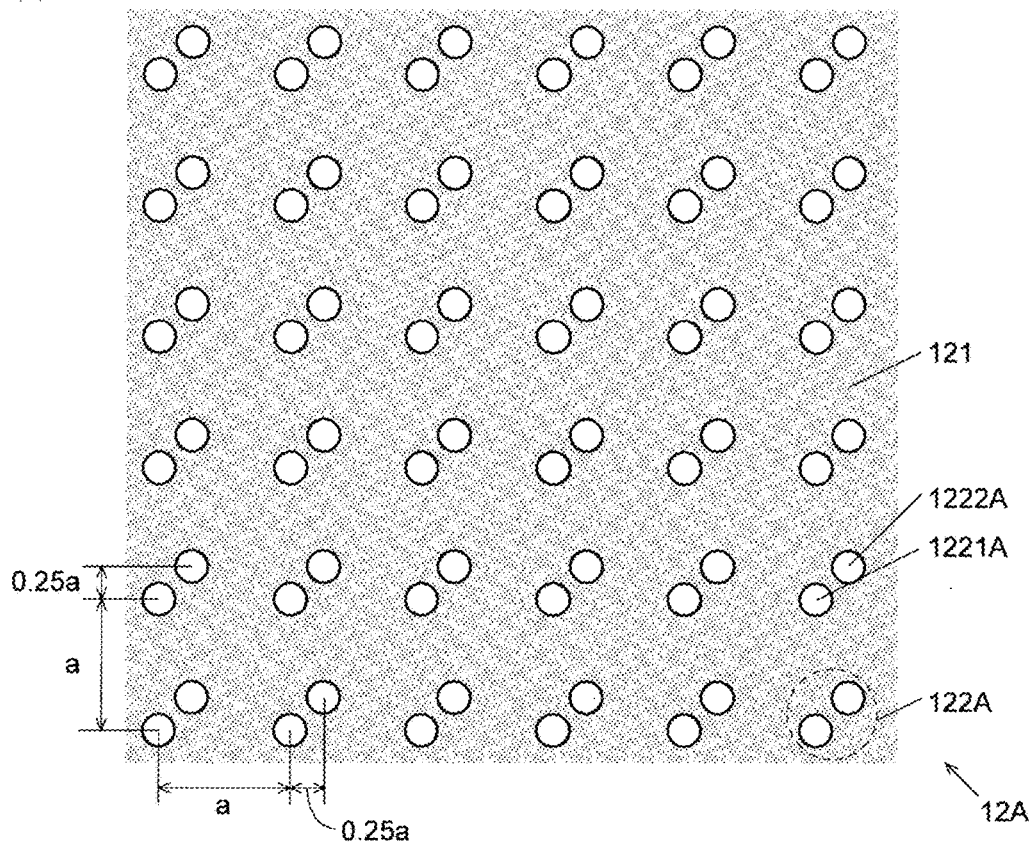
FIG. 3 is a plan view (a) and a longitudinal cross-sectional view (b) of another example of the two-dimensional photonic crystal in the two-dimensional photonic crystal surface emitting laser according to this embodiment.
Figure 3:
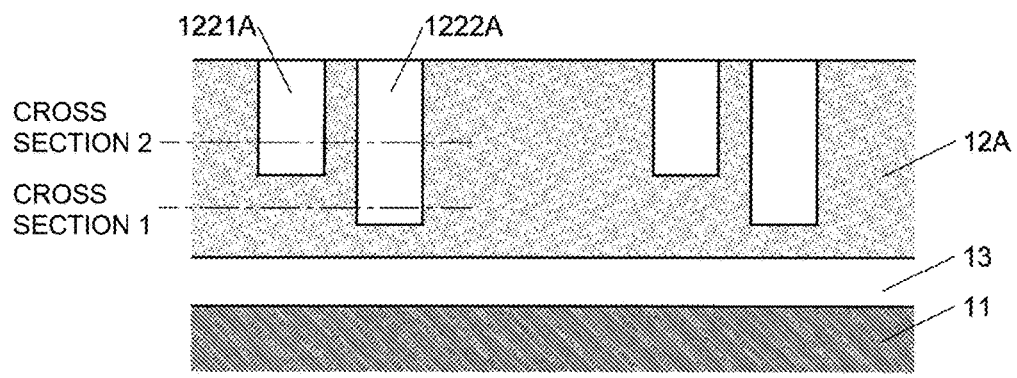
Figure 4:
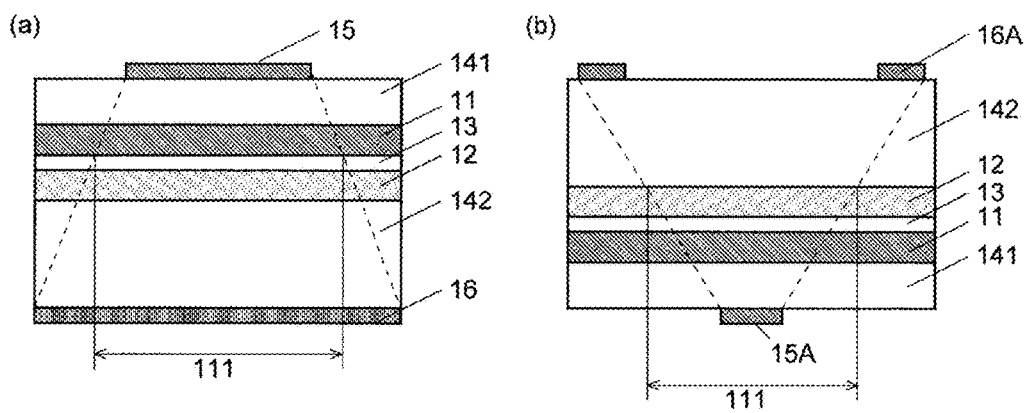
FIG. 4 is a diagram illustrating a range of current injected from a first electrode and a second electrode.

Instead of the modified refractive index region pair having two modified refractive index regions having different planar areas illustrated in FIG. 2, as illustrated in FIG. 3, a two-dimensional photonic crystal layer 12A having modified refractive index region pairs 122A including a first modified refractive index region 1221A and a second modified refractive index region 1222A which have the same planar area and different thicknesses may be used. In the modified refractive index region pair 122A, the first modified refractive index region 1221A and the second modified refractive index region 1222A are circular with the same area in planar shape, and the first modified refractive index region 1221A is smaller in thickness than the second modified refractive index region 1222A.

In addition, the planar shapes of the first modified refractive index region and the second modified refractive index region are not limited to circular. However, the planar shapes may be triangular, quadrangular, or the like. In addition, the first modified refractive index region and the second modified refractive index region need not have the same planar shape. For example, the one may be circular, and the other may be triangular. In addition, it is not necessary that the first modified refractive index region and the second modified refractive index region are holes, and members having a refractive index different from that of the base body may be buried. The first modified refractive index region and the second modified refractive index region may be made of materials different from each other.

(2) Operations of Two-Dimensional Photonic Crystal Surface Emitting Laser According to the Present Embodiment Next, operations of the two-dimensional photonic crystal surface emitting laser 10 according to this embodiment will be described. Herein, a case where the two-dimensional photonic crystal layer 12 illustrated in FIG. 2 is included will be described as an example. The other configurations are also the same.

By applying a predetermined voltage between the first electrode 15 and the second electrode 16, a current is injected into the active layer 11 from both electrodes. At this time, since the area of the second electrode 16 (the frame portion 162A of the second electrode 16A) is larger than the area of the first electrode 15 (15A), in the active layer 11, a current (charges) is intensively injected into a range (current injection range 111) which is narrower than the second electrode 16 and is wider than the first electrode 15 (FIGS. 4(a) and 4(b)). As a result, light emission having a wavelength within a predetermined wavelength band is generated from the current injection range 111 of the active layer 11. In the light emission generated in this manner, the light having a wavelength corresponding to the period length "a" of the square lattice is selectively amplified as described later within the range where the modified refractive index region pairs 122 of the two-dimensional photonic crystal layer 12 are arranged, and then, the laser oscillates. The oscillated laser light is emitted from the first electrode 15 side to the outside. At this time, in the two-dimensional photonic crystal surface emitting laser 10, the laser light passes through the first electrode 15 which is a transparent electrode, and in the two-dimensional photonic crystal surface emitting laser 10A, the laser light passes through the window portion 161A. In addition, the laser light directed to the second electrode 16 side is reflected by the second electrode 16, and finally is emitted from the first electrode 15 side to the outside.

Figure 5:
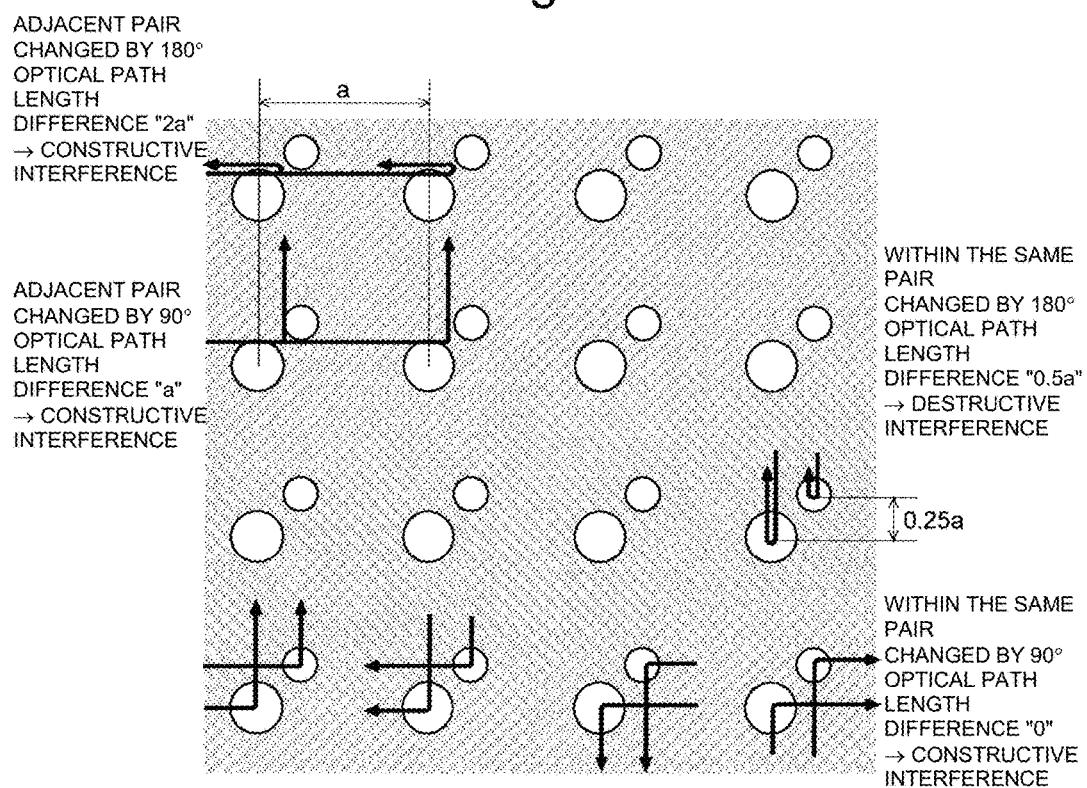
FIG. 5 is a view illustrating a principle by which light having a predetermined wavelength is amplified in the two-dimensional photonic crystal in the two-dimensional photonic crystal surface emitting laser according to this embodiment.

The light amplification in the two-dimensional photonic crystal in this example will be described. The light introduced from the current injection range 111 of the active layer 11 into the two-dimensional photonic crystal layer 12 propagates in a direction parallel to the two-dimensional photonic crystal layer 12. Then, in the modified refractive index region pair 122, the propagation direction is changed by 90° or 180° with a probability determined by the shape or the like (FIG. 5). The light whose propagation direction is changed by 90° from the x direction to the y direction (or vice versa) in each of the two adjacent modified refractive index region pairs 122 has an optical path length difference of "a", and thus, the light is strengthened by interference. In addition, the light whose propagation direction is changed by 180° in the x direction (or y direction) in each of the two adjacent modified refractive index region pairs 122 has an optical path length difference of 2a, which is also strengthened by interference. Herein, the changing of the propagation direction by 90° allows the light to diffuse and spread in a planar manner within the two-dimensional photonic crystal layer 12 and contributes to the surface light emission of the laser light, whereas the changing of the propagation direction by 180° allow the light to be localized, which becomes a cause for preventing stable surface emission.

However, in the two-dimensional photonic crystal surface emitting laser 10 according to this embodiment, stable surface emission is not hindered for the following reasons. In the same modified refractive index region pair 122, the light propagation direction is changed by 90° or 180° by the first modified refractive index region 1221 and the second modified refractive index region 1222 (FIG. 5). The light whose propagation direction is changed by 90° from the x direction to the y direction (or vice versa) has an optical path length difference of 0, and thus, the light is strengthened by interference. On the other hand, the light whose propagation direction is changed by 180° in the x direction (or y direction) has an optical path length difference of 0.5a, and thus, the light is weakened by interference. Therefore, the changing of the propagation direction by 180° in the x direction (or y direction) is suppressed. Accordingly, the localization of light is prevented, and the intensity of the light whose propagation direction is changed by 90° from the x direction to the y direction (or vice versa) can be further strengthened. In this manner, the light having the wavelength "a" in the two-dimensional photonic crystal layer 12 is strengthened by the interference, and this interference is repeatedly generated in the wide region in the two-dimensional photonic crystal layer 12, so that the laser oscillates.

In the two-dimensional photonic crystal surface emitting laser 10 according to this embodiment, since the first modified refractive index region 1221A is equal to or larger in planar area and is smaller in thickness than the second modified refractive index region 1222A, the volumes of the first modified refractive index region 1221 and the second modified refractive index region 1222 are relatively close. Therefore, the intensities of light whose propagation direction is changed by 180° in the first modified refractive index region 1221 and the second modified refractive index region 1222 are close to each other, and the effect of weakening the light by interference is increased. Accordingly, in the two-dimensional photonic crystal surface emitting laser 10 according to this embodiment, the localization of light is further suppressed as compared with the two-dimensional photonic crystal surface emitting laser using a modified refractive index region pair in the related art, and thus, it is possible to obtain a laser light having a larger output power.

(3) Detailed Design of Two-Dimensional Photonic Crystal Surface Emitting Laser According to the Present Invention As described above, the two-dimensional photonic crystal surface emitting laser 10 according to this embodiment has the feature in that the volumes of the first modified refractive index region 1221 and the second modified refractive index region 1222 are relatively close and the feature in that the flexibility in designing the two-dimensional photonic crystal surface emitting laser capable of obtaining stable laser oscillation is high. Hereinafter, an example of the detailed design of the two-dimensional photonic crystal surface emitting laser according to the present invention will be described.

Figure 6:
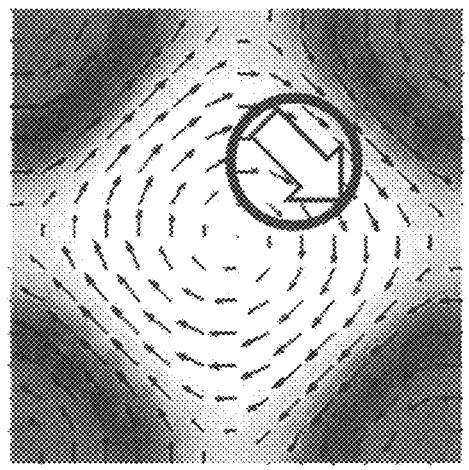
FIG. 6 is a diagram illustrating a result of calculation of direction and intensity of an electric field formed around one modified refractive index region pair with respect to the two-dimensional photonic crystal surface emitting laser according to this embodiment.
Figure 6:
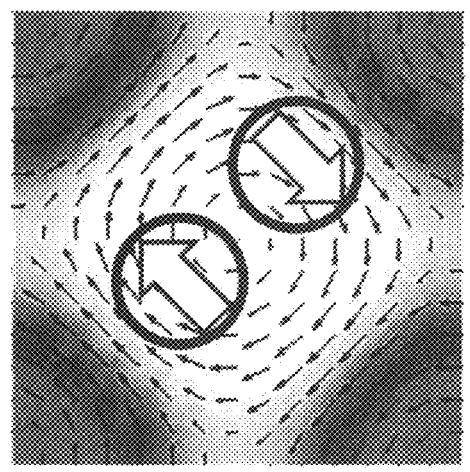

FIG. 6 illustrates the result of calculation of direction and intensity of an electric field formed around one modified refractive index region pair. Herein, the calculations are performed in cross section 1 and cross section 2 parallel to the two-dimensional photonic crystal layer 12 illustrated in FIG. 5, respectively. The cross section 2 includes both the first modified refractive index region 1221A and the second modified refractive index region 1222A, whereas the cross section 1 includes only the second modified refractive index region 1222A. According to the result of calculation of the of FIG. 6, in the cross section 2, a point symmetric electric field is formed around the point between the first modified refractive index region 1221A and the second modified refractive index region 1222A, and the electric field within the first modified refractive index region 1221A and the electric field of the second modified refractive index region 1222A have the same magnitude and different directions by 180°. Therefore, the electric field component parallel to the cross section 2 is canceled out. On the other hand, in the cross section 1, the direction of the electric field is the same as the cross section 1, and only the second modified refractive index region 1222A exists, so that the electric field components of the portion of the second modified refractive index region 1222A and the portion having no hole immediately below the first modified refractive index region 1221A facing the portion of the second modified refractive index region 1222A are not canceled out. As a result, the laser light is easily emitted in a direction perpendicular to the two-dimensional photonic crystal layer 12 (and the electric field component parallel to the cross section 2).

Figure 7:
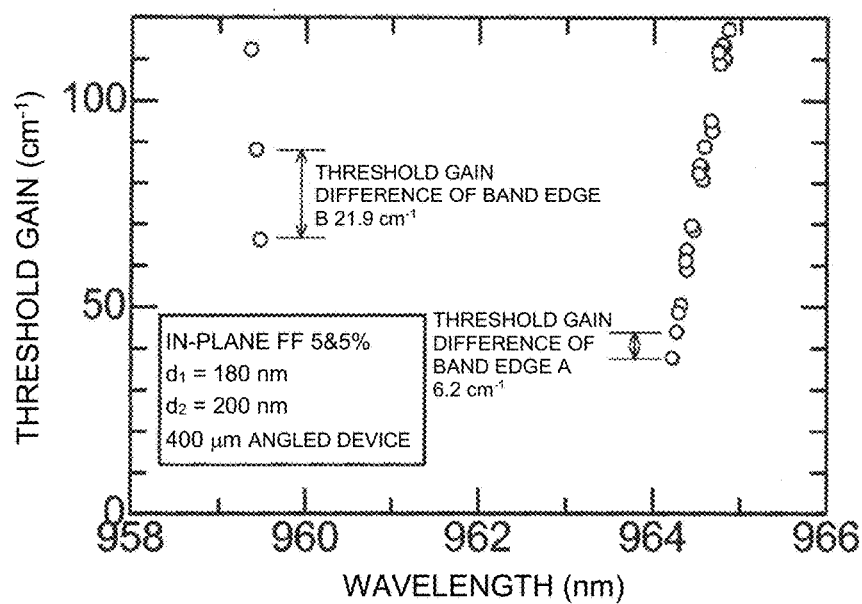
FIG. 7 is a graph illustrating a result of calculation of threshold gain with respect to the two-dimensional photonic crystal surface emitting laser according to this embodiment.

FIG. 7 illustrates an example where the threshold gain is calculated with respect to the two-dimensional photonic crystal surface emitting laser according to the present invention. Herein, the calculation is performed for a case where both of the first modified refractive index region 1221A and the second modified refractive index region 1222A have a shape of a circle occupying an area of 5% of the plane, the thickness $d_1$ of the first modified refractive index region 1221A is 180 nm, the thickness $d_2$ of the second modified refractive index region 1222A is 200 nm, and the photonic crystal region is 400 µm in one-side length. Hereinafter, a case where ratios of areas occupied by the first modified refractive index region and the second modified refractive index region in the plane are x % and y % is referred to as "FFx&y %" ("FF5&5%" in the example of FIG. 7). The "FF" is an abbreviation for "Filling Factor". According to this calculation, with respect to the two different vibration modes called "band edge A" and "band edge B", the values of the threshold gains of the fundamental vibration mode having the smallest threshold gain, the first higher-order mode having the second smallest threshold gain, and the second and subsequent higher-order modes having larger threshold gains are obtained. The difference between the values of the threshold gains of the fundamental vibration mode and the first higher-order mode is referred to as "threshold gain difference $\Delta\alpha$". As the value of the threshold gain difference $\Delta\alpha$ is increased, the stable laser oscillation of only the fundamental vibration mode is obtained. From the calculation results, in this example, since the threshold gain at the band edge B is smaller than that at the band edge A, the band edge A oscillates.

Figure 8:
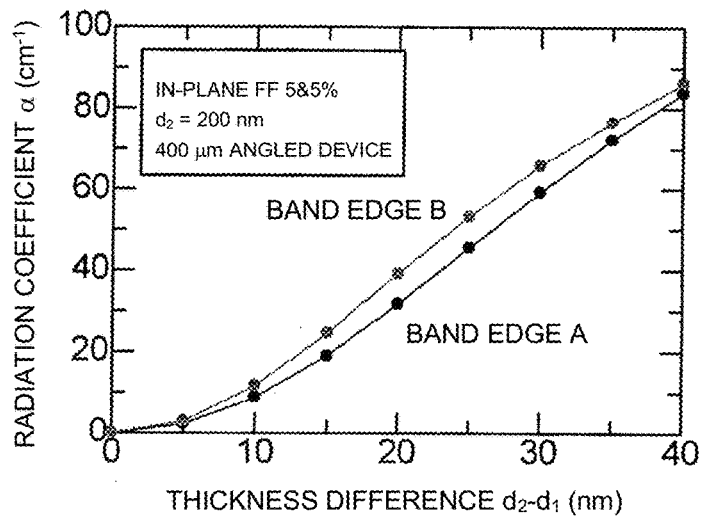
FIG. 8 is a graph illustrating a result of calculating a threshold gain difference with respect to the two-dimensional photonic crystal surface emitting laser according to this embodiment.
Figure 9:
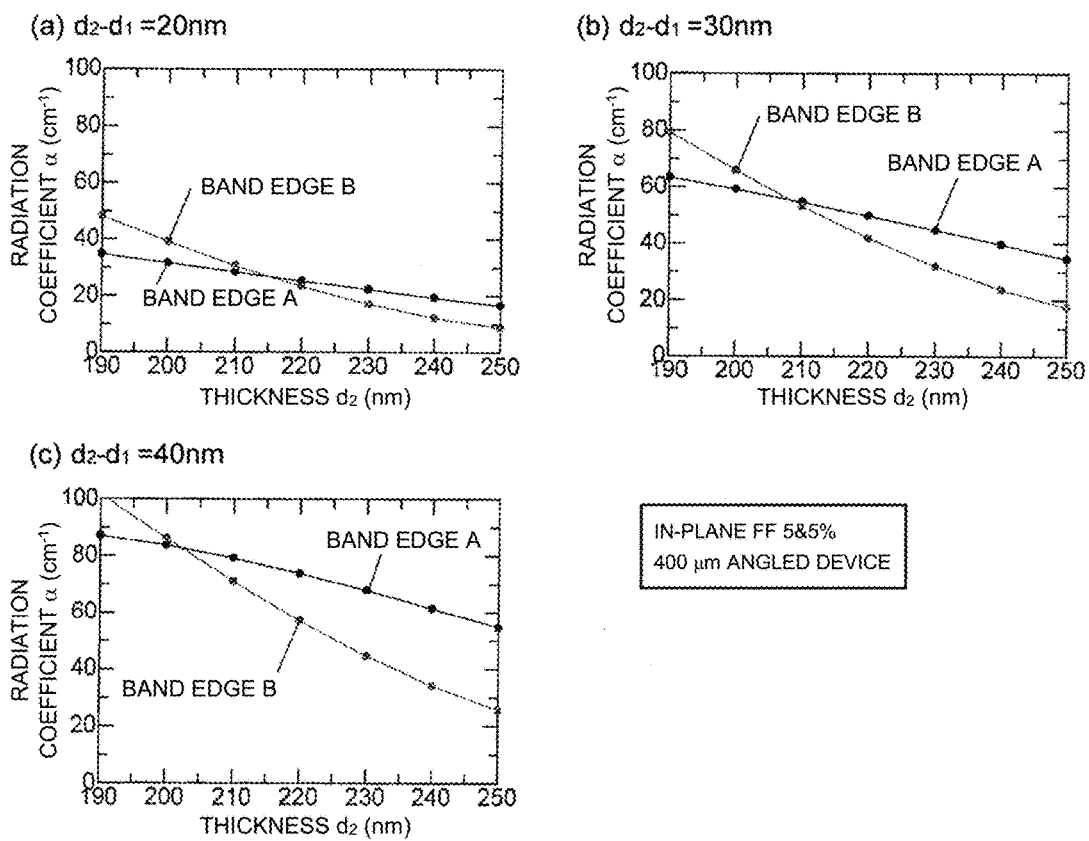
FIG. 9 is a graph illustrating a result of calculation of a threshold gain difference in a plurality of examples where thicknesses of a first modified refractive index region and a second modified refractive index region are different with respect to the two-dimensional photonic crystal surface emitting laser according to this embodiment.

In FIG. 7, with respect to the threshold gain difference $\Delta\alpha$, it can be understood that the value of the threshold gain difference $\Delta\alpha$ at the band edge B is larger than that at the band edge A and stable laser oscillation can be expected. Therefore, if the design is made so that the threshold gain at the band edge B is the lowest, stable oscillation with a larger area can be expected. Therefore, calculation of the radiation coefficient $\alpha_v$ in the vertical direction of the plane, which is related to the value of the threshold gain $\alpha$, is performed. FIG. 8 is a graph illustrating the result of calculation of the radiation coefficients $\alpha_v$ in the vertical direction of the plane at the band edge A and the band edge B after changing only the thickness $d_1$ of the first modified refractive index region 1221A from the example of FIG. 7. In addition, FIG. 9 is a graph illustrating the results of calculation of the radiation coefficient $\alpha_v$ in the vertical direction of the plane at the band edge A and the band edge B after changing both thicknesses $d_1$ and $d_2$ into various values. The horizontal axis of these graphs is the difference between the thicknesses $d_2$ and $d_1$ in FIG. 8 and is the thickness $d_2$ in FIG. 9. While changing the values of the thicknesses $d_1$ and $d_2$ in this manner, detailed design of the two-dimensional photonic crystal surface emitting laser can be performed.

Figure 10:
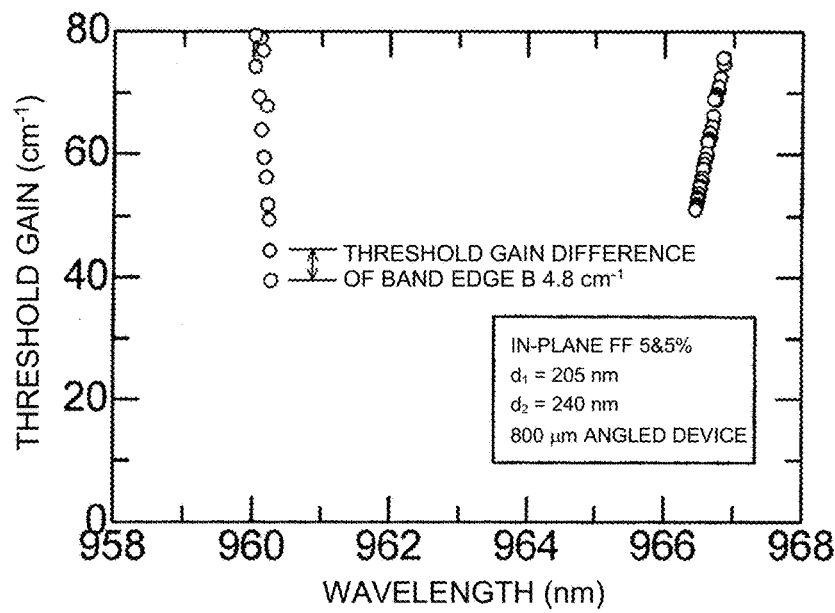
FIG. 10 is a graph illustrating a result of calculation of a threshold gain in an example where the thicknesses of the first modified refractive index region and the second modified refractive index region and device sizes are different with respect to the two-dimensional photonic crystal surface emitting laser according to this embodiment.

FIG. 10 illustrates an example where the threshold gain is calculated in a case where the photonic crystal region is set to have a one-side length 800 μm which is larger than that of the example of FIG. 7. Herein, FF 5&5%, $d_1$ is set to 205 nm, and $d_2$ is set to 240 nm. Although the size of the photonic crystal region is larger than that of the example of FIG. 7, the threshold gain difference $\Delta\alpha$ is obtained to be 4.8 $cm^{-1}$ at the band edge B, which is approximately equal to the example of FIG. 7. As the size of the device is increased, the output power of the laser light can be increased. In this example, it can be considered that a laser element having an output power level of 20 to 30 W can be obtained.

Figure 11:
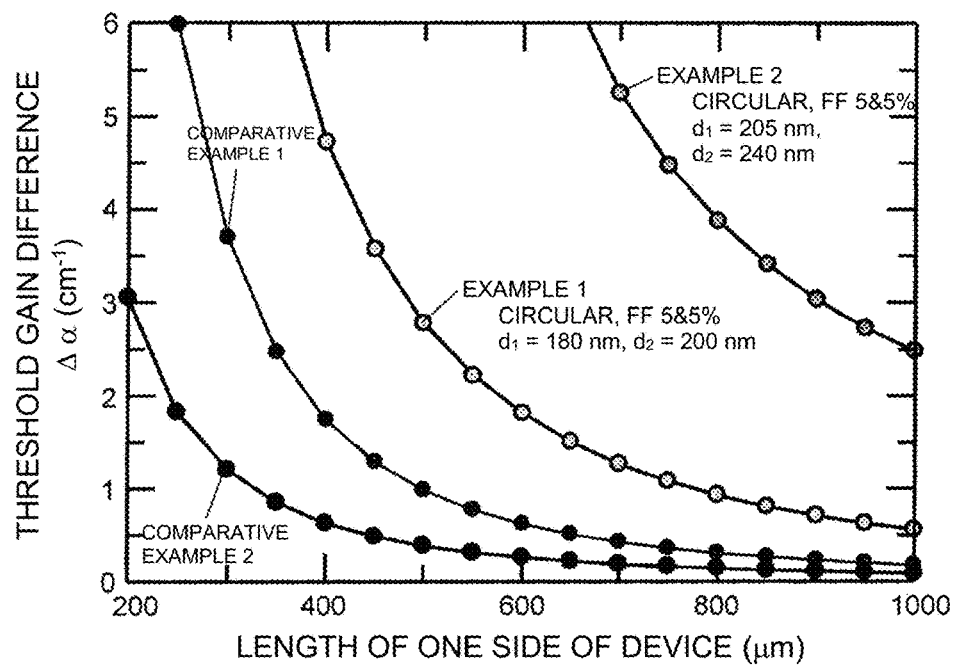
FIG. 11 is a graph illustrating a result of calculation of a relationship between the device size and the threshold gain difference in a plurality of examples (Examples 1 and 2) and Comparative Examples 1 and 2 in the two-dimensional photonic crystal surface emitting laser according to this embodiment.

FIG. 11 is a graph illustrating the result of calculation of the threshold gain difference $\Delta\alpha$ after changing the size of the device. Herein, two examples (Examples 1 and 2) in which the values of FF, $d_1$ and $d_2$ are the same as the values used in the calculations in FIGS. 7 and 10 are illustrated. As comparative examples, an example (Comparative Example 1) where the first modified refractive index region has a larger area and a larger thickness than the second modified refractive index region and an example (Comparative Example 2) where the only one modified refractive index region is arranged at each lattice point are illustrated. In addition, in Comparative Examples 1 and 2, it is considered that the output power of the laser light can be increased as compared with the case of using the circular modified refractive index region in the related art, and thus, the modified refractive index region having a planar shape of an isosceles right triangle is used. From this calculation result, it can be understood that the devices can be made larger in the case of obtaining the threshold gain difference $\Delta\alpha$ having the same value in Examples 1 and 2 than in Comparative Examples 1 and 2. Therefore, in Examples 1 and 2, the output power of laser light can be made larger than that of Comparative Examples 1 and 2.

Figure 12:
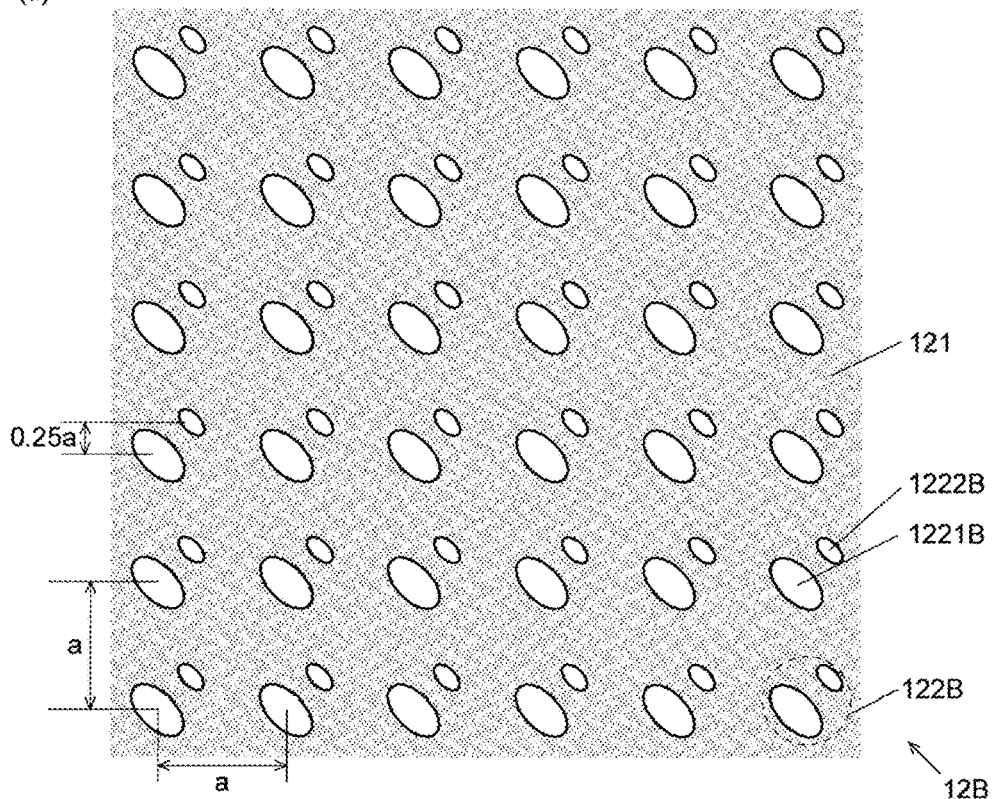
FIG. 12 is a plan view (a), a longitudinal cross-sectional view (b), and a partial enlarged plan view (c) of a two-dimensional photonic crystal in the two-dimensional photonic crystal surface emitting laser according to the embodiment using two modified refractive index regions having non-circular shapes.
Figure 12:
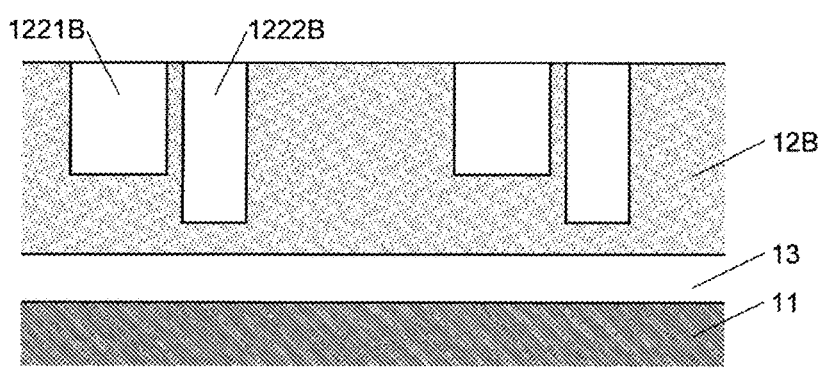
Figure 12:
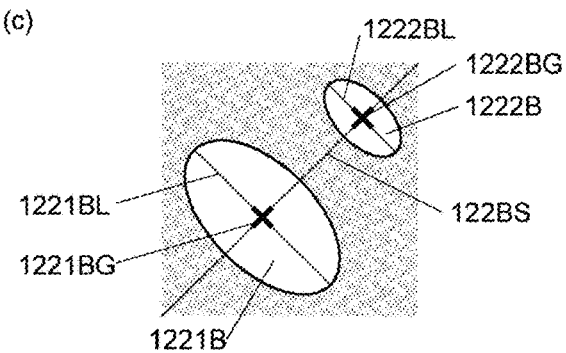
Figure 13:
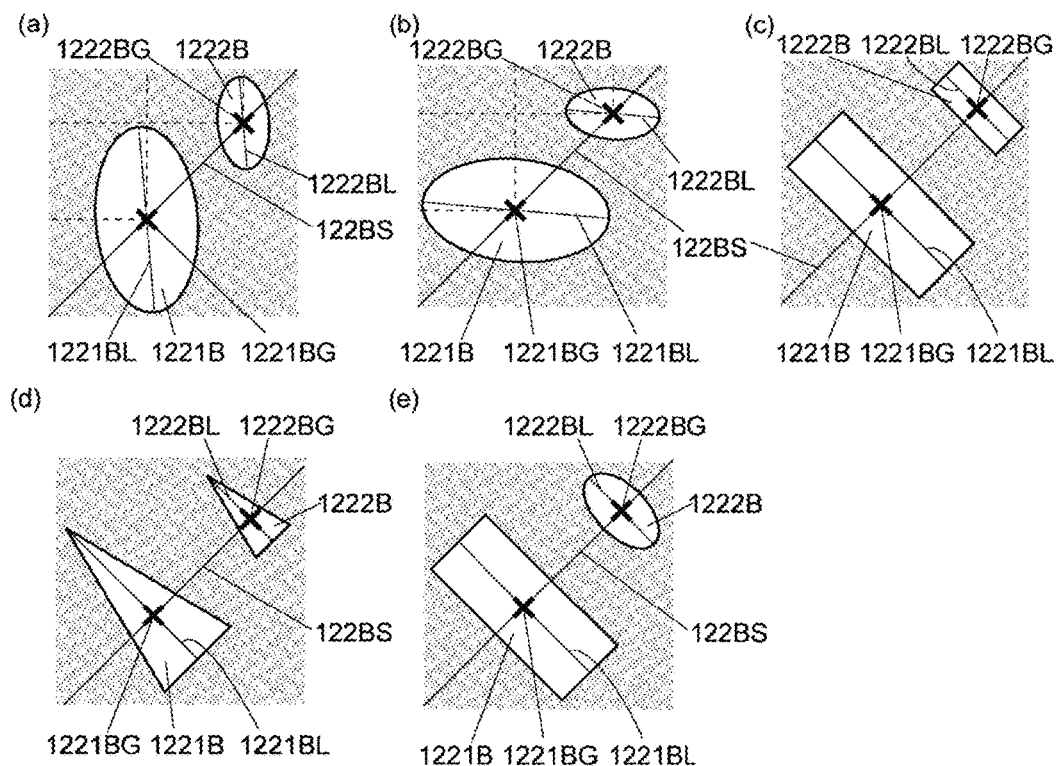
FIG. 13 is a plan view illustrating a modified refractive index region pair in a plurality of Modified Examples using two modified refractive index regions of which one or both has a non-circular shape.

(4) Two-Dimensional Photonic Crystal Surface Emitting Laser According to the Embodiment Using Non-Circular Modified Refractive Index Region FIG. 12 illustrates a two-dimensional photonic crystal layer 12B using a modified refractive index region pair 122B having a first modified refractive index region 1221B having an elliptical planar shape and a second modified refractive index region 1222B having an elliptical planar shape. Except for the two-dimensional photonic crystal layer 12B, the configuration of the two-dimensional photonic crystal surface emitting laser having the two-dimensional photonic crystal layer 12B is the same as that of the above-described two-dimensional photonic crystal surface emitting laser 10. The first modified refractive index region 1221B is arranged so that the reference axis (major axis of the ellipse) 1221BL is in a direction of 90° with respect to the straight line 122BS connecting the center of gravity 1221BG of the first modified refractive index region 1221B and the center of gravity 1222BG of the second modified refractive index region 1222B. Similarly, the second modified refractive index region 1222B is arranged so that the reference axis (major axis of the ellipse) 1222BL is in a direction of 90° with respect to the straight line 122BS (FIG. 12 (c)). In addition, the reference axis 1221BL of the first modified refractive index region 1221B and/or the reference axis 1222BL of the second modified refractive index region 1222B is not necessarily in the direction of 90° with respect to the straight line 122BS. For example, as illustrated in FIGS. 13(a) and 13(b), the reference axis may be in the range of 45° to 135°. In FIGS. 13(a) and 13(b), the directions of 45° and 135° are indicated by broken lines.

In this embodiment, the center of gravity 1221BG of the first modified refractive index region 1221B and the center of gravity 1222BG of the second modified refractive index region 1222B are arranged to be shifted by 0.25a in the x direction and by 0.25a in the y direction. However, in the present invention, the magnitude and direction of the shift of the center of gravity are not limited to this example. In this embodiment, the shapes of the ellipses of the first modified refractive index region 1221B and the second modified refractive index region 1222B are similar to each other, in which the ratio of the major axis to the minor axis is 5:3. However, the present invention is not limited to the ratio and is not limited to being similar. The first modified refractive index region 1221B is smaller in thickness than the second modified refractive index region 1222B having a smaller planar shape (FIG. 12 (b)).

Figure 14:
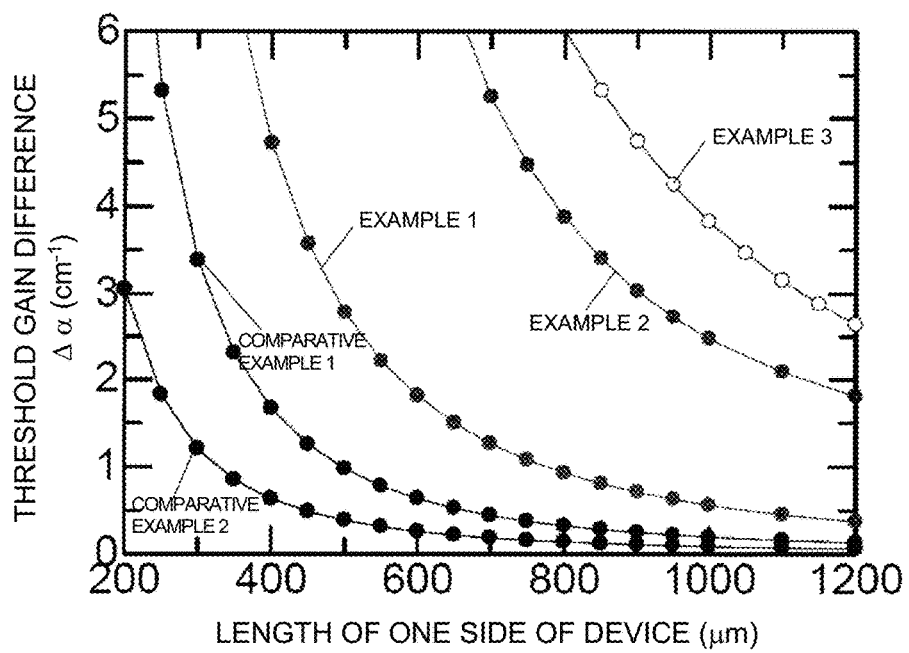
FIG. 14 is a graph illustrating a result of calculation of threshold gain difference with respect to the two-dimensional photonic crystal surface emitting laser using the two-dimensional photonic crystal illustrated in FIG. 12 and other Examples together with other Examples and Comparative Examples.

With respect to the two-dimensional photonic crystal surface emitting laser (Example 3) using the two-dimensional photonic crystal layer 12B illustrated in FIG. 12, the result of calculation of the threshold gain difference $\Delta\alpha$ after changing the size of the device is illustrated in the graph of FIG. 14. Together with FIG. 14, the data of the same Examples and Comparative Examples as in FIG. 11 are illustrated. The size of the device is obtained in a range (maximum 1800 μm) wider than that in FIG. 11. From this result, it can be understood that, in the case of obtaining the threshold gain difference $\Delta\alpha$ having the same value, the device in Example 3 can be made larger than those in Examples 1 and 2 (and each Comparative Example). This is because, as compared with Examples 1 and 2 using the modified refractive index region pair configured with two circular modified refractive index regions, in Example 3, the distribution of the refractive index is prevented from having a larger dimension in the direction of the straight line 122B S connecting the centers of gravity of the two modified refractive index regions, and the modified refractive index region pair becomes closer to a circle as a whole, so that it is possible to suppress the effect of strengthening the light by the interference from being weakened.

In the configurations illustrated in FIGS. 12 and 13(a) and 13(b), the planar shapes of the two modified refractive index regions are both elliptical. However, as illustrated in FIG. 13(c), a rectangle or a quadrangle other than a square may be adopted, and as illustrated in FIG. 13(d), an isosceles triangle or a triangle other than a regular triangle may be adopted. Furthermore, a polygon having a pentagonal shape or more other than a regular polygon or an amorphous shape formed of an arbitrary closed curve may be adopted. In any case, the two modified refractive index regions may be arranged so that the axis (reference axis) at which the second moment of area $I_x$ and $I_y$ are smaller, out of the x axis and the y axis (different from the x direction and the y direction defined by the above-described square lattice) at which the product of inertia of area $I_{xy}$ becomes 0, is in a direction of 45° to 135° with respect to the straight line connecting the centers of gravity of the two modified refractive index regions.

Figure 15:
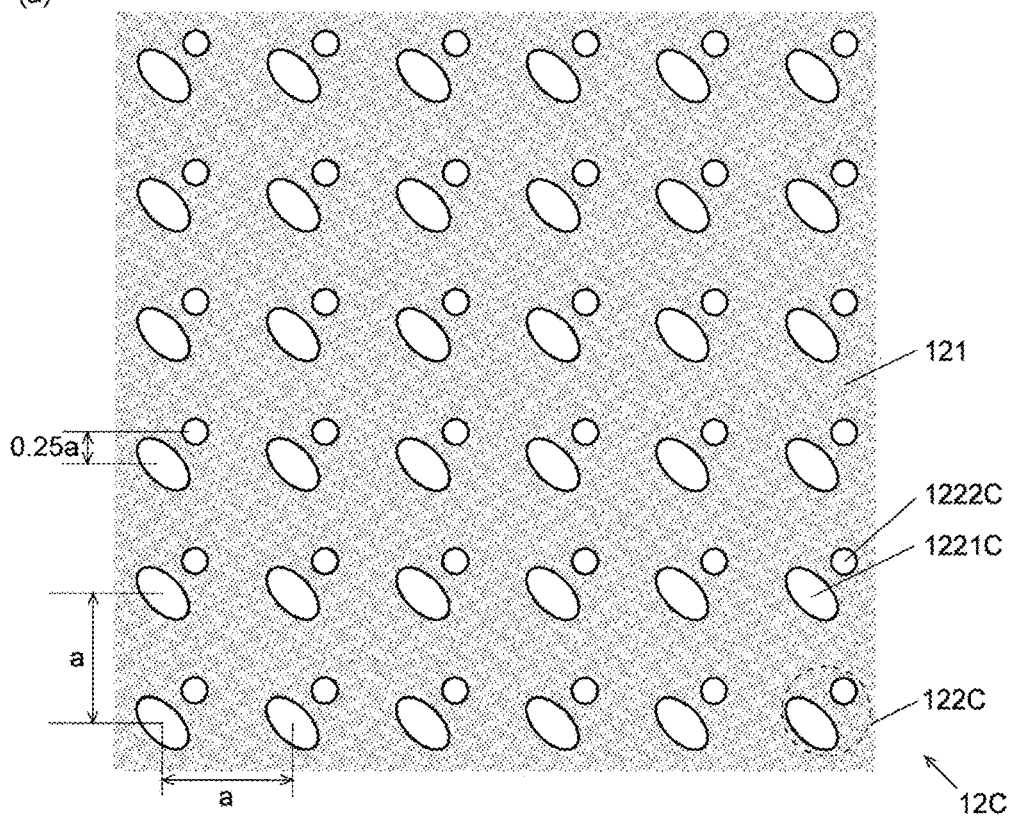
FIG. 15 is a plan view (a), a longitudinal cross-sectional view (b), and a partial enlarged plan view (c) of a two-dimensional photonic crystal in the two-dimensional photonic crystal surface emitting laser according to the embodiment using two modified refractive index regions of which one has a non-circular shape and the other has a circular shape.
Figure 15:
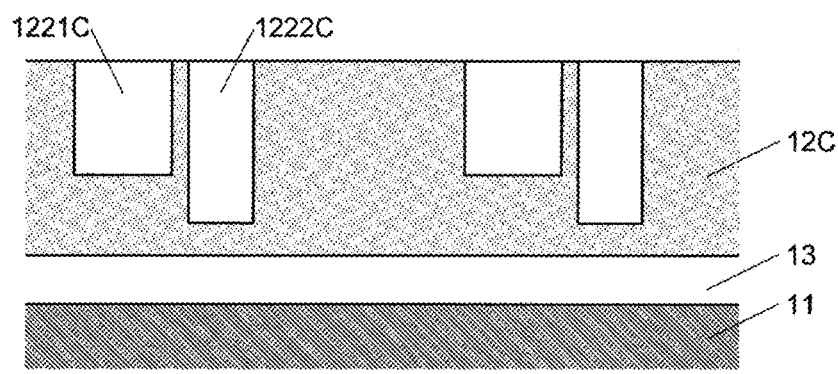
Figure 15:
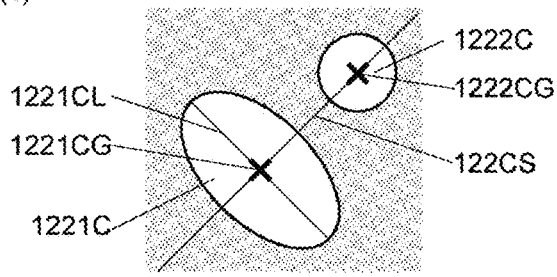
Figure 16:
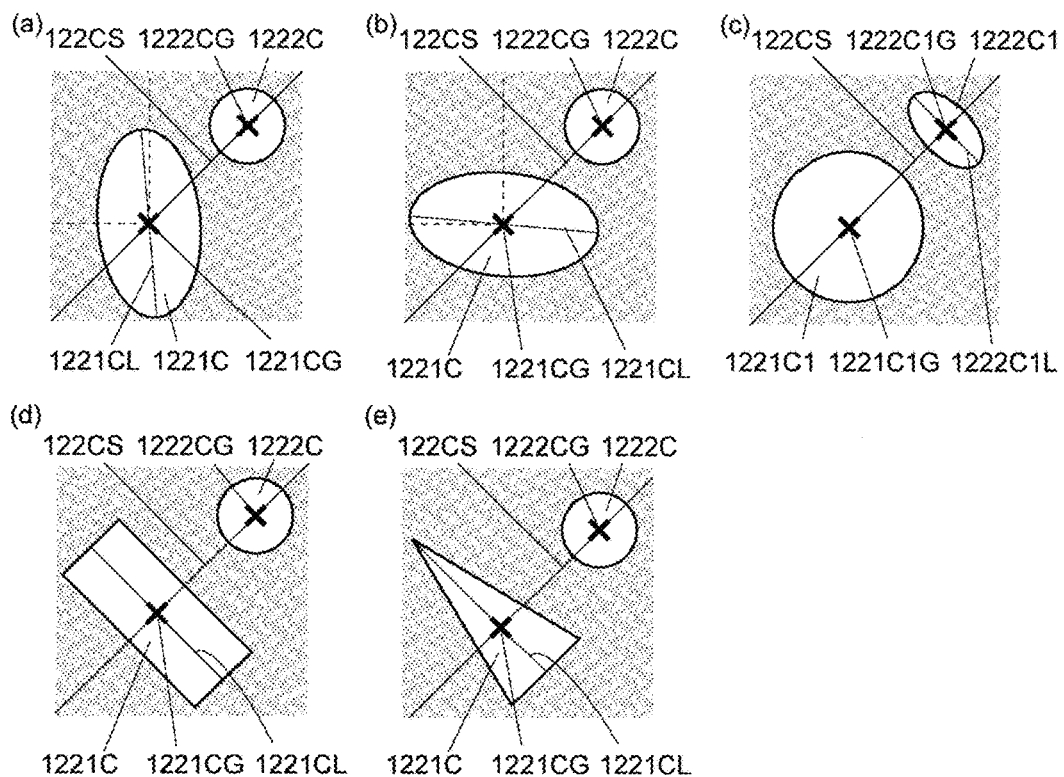
FIG. 16 is a plan view illustrating a modified refractive index region pair in a plurality of Modified Examples using two modified refractive index regions of which one has a non-circular shape and the other has a circular shape.

FIG. 15 illustrates a two-dimensional photonic crystal layer 12C using a modified refractive index region pair 122C configured with a non-circular elliptical first modified refractive index region 1221C and a circular second modified refractive index region 1222C. The configurations of the two-dimensional photonic crystal surface emitting laser having the two-dimensional photonic crystal layer 12C other than the two-dimensional photonic crystal layer 12C are the same as those of the two-dimensional photonic crystal surface emitting laser 10 described above. The first modified refractive index region 1221C is arranged so that the reference axis (major axis of the ellipse) 1221CL is in a direction of 90° with respect to the straight line 122CS connecting the center of gravity 1221CG of the first modified refractive index region 1221C and the center of gravity 1222CG of the second modified refractive index region 1222C (FIG. 15 (c)). In addition, the direction of the major axis 1221CL of the ellipse is not limited to the direction of 90° and may be a direction within a range of 45° to 135° as illustrated in FIGS. 16(a) and 16(b). The first modified refractive index region 1221C is smaller in thickness than the second modified refractive index region 1222C having a smaller planar shape (FIG. 15(b)).

Figure 17:
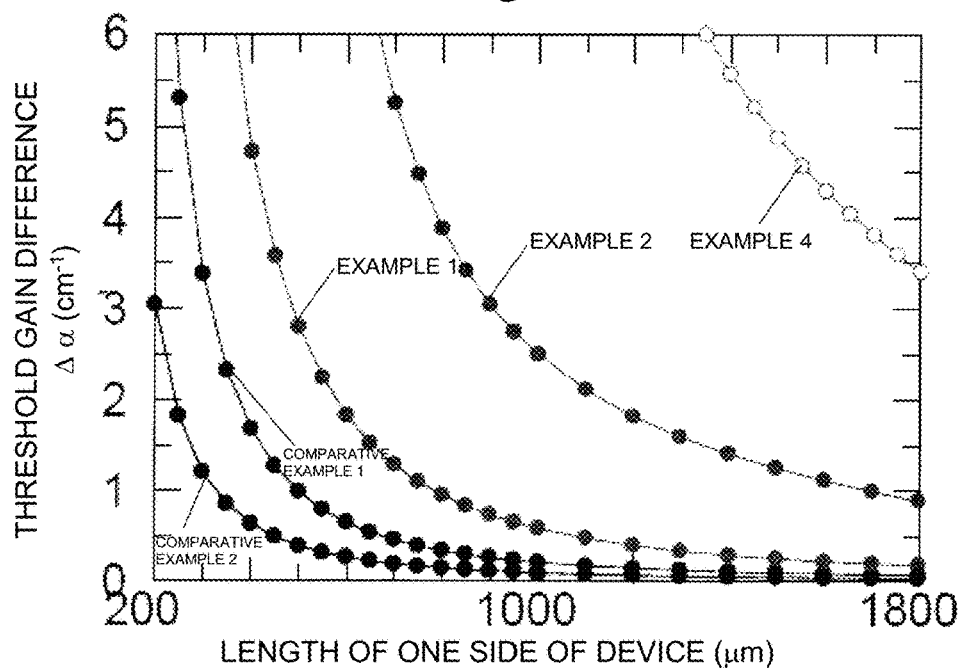
FIG. 17 is a graph illustrating a result of calculation of a threshold gain difference with respect to the two-dimensional photonic crystal surface emitting laser using the two-dimensional photonic crystal illustrated in FIG. 15 and other Examples together with other Examples and Comparative Examples.

With respect to the two-dimensional photonic crystal surface emitting laser (Example 4) using the two-dimensional photonic crystal layer 12B illustrated in FIG. 15, the result of calculation of the threshold gain difference Δα after changing the size of the device is illustrated in the graph of FIG. 17. Together with FIG. 17, the data of the same Examples and Comparative Examples as in FIG. 11 are illustrated. The size of the device is obtained in the same range as in the example of FIG. 14. From this result, it can be understood that, in the case of obtaining the threshold gain difference Δα having the same value, the device can be made larger than those in Examples 1 and 2 (and each Comparative Example). In addition, as compared with Example 3 illustrated in FIG. 14, in the case of obtaining the threshold gain difference Δα having the same value, the device can be made larger. This is because the distribution of the refractive index is prevented from having a larger dimension in the direction of the straight line 122CS connecting the centers of gravity of the two modified refractive index regions, and asymmetry occurs in the electric field generated around the modified refractive index region pair 122C, and thus, the intensity of the electric field is prevented from being decreased due to the interference, so that the intensity of the light can be increased.

In the example of FIG. 15 and FIGS. 16(a) and 16(b), the first modified refractive index region 1221C has an elliptical shape, but as illustrated in FIG. 16(c), the first modified refractive index region 1221C1 may have a circular shape, and the second modified refractive index region 1222C1 may have a non-circular shape such as an elliptical shape. In this example, the reference axis (major axis of the ellipse) 1221C1L of the second modified refractive index region 1222C 1 is arranged so as to be in a direction of 90° with respect to a straight line 122C1S connecting the center of gravity 1221C1G of the first modified refractive index region 1221C1 and the center of gravity 1222C1G of the second modified refractive index region 1222C1. Alternatively, as illustrated in FIGS. 16(d) and 16(e), the non-circular modified refractive index region may be formed as a rectangle or a quadrangle other than a square, an isosceles triangle or a triangle other than a regular triangle, a polygon having a pentagonal shape or more other than a regular polygon, or an amorphous shape formed of an arbitrary closed curve. In any case, the modified refractive index region having a non-circular shape may be arranged so that the axis (reference axis) at which the second moment of area $I_x$ and $I_y$ are smaller, out of the x axis and the y axis (different from the x direction and the y direction defined by the above-described square lattice) at which the product of inertia of area $I_{xy}$ becomes 0, is in a direction of 45° to 135° with respect to the straight line connecting the centers of gravity of the two modified refractive index regions.

Figure 18:
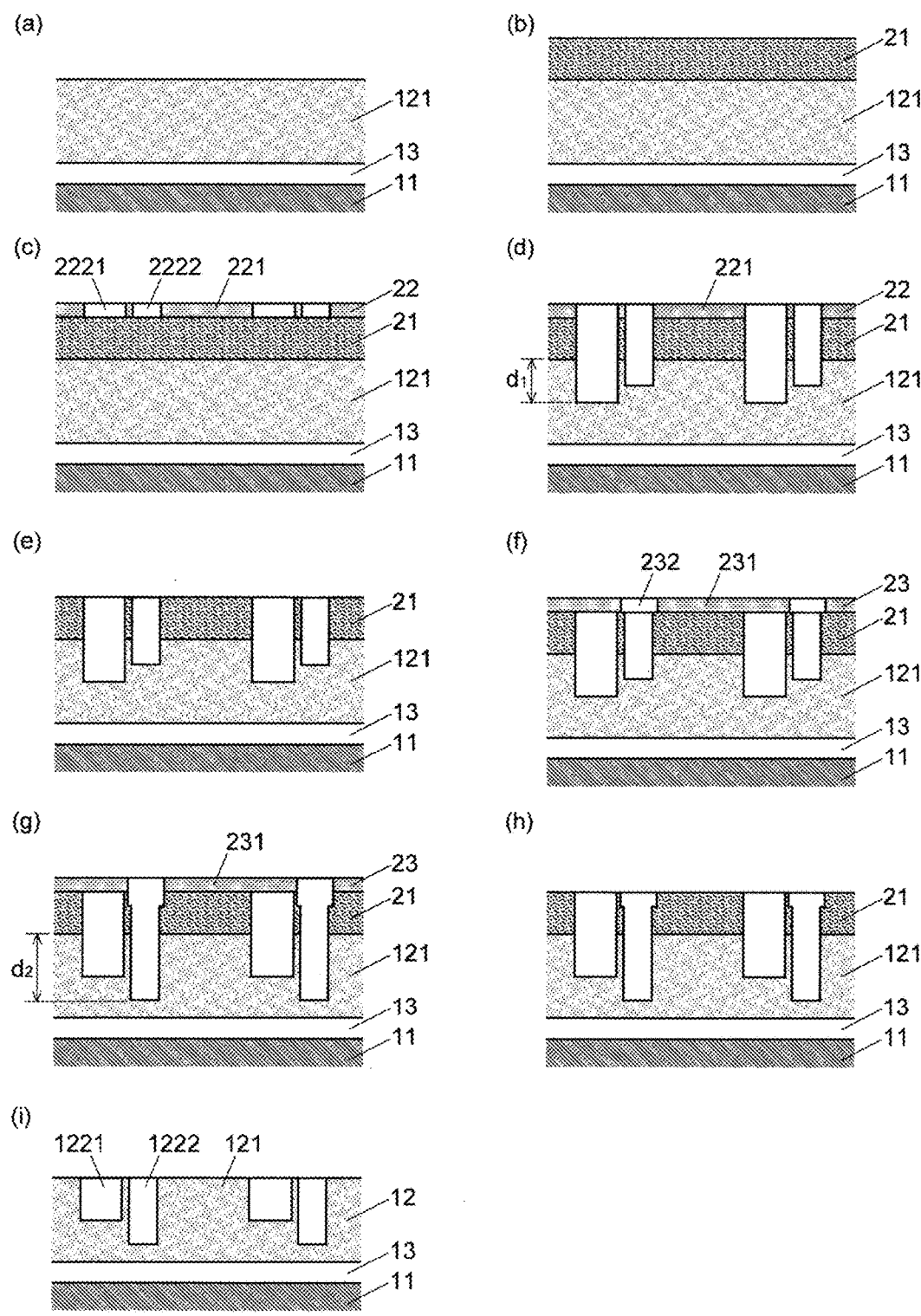
FIG. 18 is a view illustrating a method of manufacturing a two-dimensional photonic crystal surface emitting laser according to an embodiment of the present invention.

(5) Manufacturing Method of Two-Dimensional Photonic Crystal Surface Emitting Laser of the Present Embodiment A method of manufacturing the two-dimensional photonic crystal surface emitting laser 10 according to this embodiment will be described by mainly concentrating on a method of producing the two-dimensional photonic crystal layer 12 with reference to FIG. 18.

First, the active layer 11 is formed on the second cladding layer 142, and the spacer layer 13 is formed on the active layer 11. The base body 121 of the two-dimensional photonic crystal layer 12 is formed on the spacer layer 13 (FIG. 18(a)). Since the methods of producing the second cladding layer 142, the active layer 11, the spacer layer 13, and the base body 121 are the same as the methods used in the two-dimensional photonic crystal surface emitting laser in the related art, and thus, detailed description thereof is omitted.

Next, a lower mask layer 21 is formed on the base body 121 (FIG. 18(b)). The lower mask layer 21 is made of a silicon nitride ($SiN_x$) and may be manufactured by a plasma CVD method.

Next, by applying a first resist 221 on the lower mask layer 21 and forming a pattern where first holes 2221 and second holes 2222 corresponding to the planar shapes of the first modified refractive index region 1221 and the second modified refractive index region 1222 are arranged by an exposure method or an electron beam method, a first upper mask 22 is produced (FIG. 18(c)).

Next, by introducing an etching gas (etchant) through the first holes 2221 and the second holes 2222 of the first upper mask 22, the lower mask layer 21 and the base body 121 immediately below the first holes 2221 and the second holes 2222 are etched down to a predetermined first depth $d_1$ (FIG. 18(d)). As the etching gas, a mixed gas of hydrogen iodide and xenon is used. Instead of the mixed gas of hydrogen iodide and xenon, chlorine may be used as an etching gas, and instead of the etching gas, a liquid etchant may be used. In a case where the areas of the first hole 2221 and the second hole 2222 are different from each other, since the hole having a larger area more easily permeate the etchant, the hole having a larger area is etched more deeply. In this case, etching is performed until the depth of the hole having a larger area reaches a first depth $d_1$.

Next, after removing the first upper mask 22 (FIG. 18(e)), by applying a second resist 231 on the lower mask layer 21 and forming holes 232 in the second resist 231 only at positions corresponding to the second modified refractive index region 1222 whose thickness is larger than that of the first modified refractive index region 1221 by an exposure method or an electron beam method, a second upper mask 23 is produced (FIG. 18(f)). The size and shape of the hole 232 do not matter unless the hole encompasses the entire planar shape of the corresponding second modified refractive index region 1222 and does not cover the planar shape of the first modified refractive index region 1221. If this condition is satisfied, the positions of the holes 232 and the second modified refractive index regions 1222 need not to be strictly matched.

Next, by introducing an etching gas (etchant) through the holes 232 of the second upper mask 23, only the second modified refractive index regions 1222 are etched down to a predetermined second depth $d_2$ (FIG. 18(g)). In this case, in a case where the hole 232 of the second upper mask 23 are formed so as to protrude from the planar shape of the second modified refractive index region 1222, the lower mask layer 21 is etched in the protruded portion. However, by appropriately setting the thickness of the lower mask layer 21, the base body 121 is not etched so as to protrude from the second modified refractive index region 1222.

Next, by removing the second upper mask 23 (FIG. 18(h)) and further removing the lower mask layer 21, the two-dimensional photonic crystal layer 12 is completed (FIG. 18(i)). The removing of the lower mask layer 21 is performed by using hydrogen fluoride which is an etchant which does not etch GaAs which is the material of the base body 121 but can etch $SiN_x$ which is the material of the lower mask layer 21.

After that, by producing the first cladding layer 141 on the two-dimensional photonic crystal layer 12, producing the first electrode 15 on the surface of the first cladding layer 141, and producing the second electrode 16 on the surface of the second cladding layer 142, the two-dimensional photonic crystal surface emitting laser 10 is completed. Since the method of manufacturing the first cladding layer 141, the first electrode 15, and the second electrode 16 is the same as the method used in the two-dimensional photonic crystal surface emitting laser in the related art, detailed description thereof will be omitted.

Figure 19:
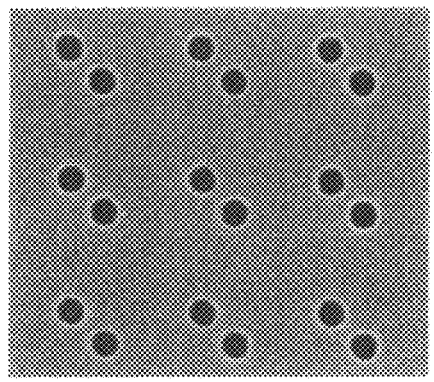
FIG. 19 illustrates electron microscope images of an upper surface (a) and a longitudinal cross section (b) of a two-dimensional photonic crystal layer being produced by the method of manufacturing the two-dimensional photonic crystal surface emitting laser according to this embodiment.
Figure 19:
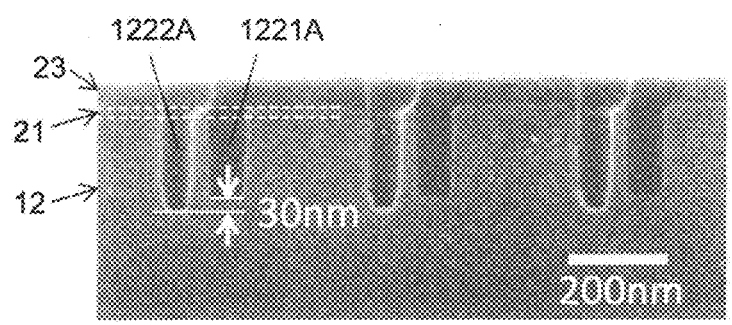

FIG. 19 illustrates electron microscope images of the two-dimensional photonic crystal layer produced by the method of manufacturing the two-dimensional photonic crystal surface emitting laser according to the present invention. This photograph is taken at the stage before the second upper mask 23 and the lower mask layer 21 are removed (corresponding to FIG. 18(g)) after the production of the two-dimensional photonic crystal layer. From these electron microscope images, it can be seen that pairs (modified refractive index region pairs) of two holes having a depth of about 30 nm are formed in the two-dimensional photonic crystal layer 12. In the lower mask layer 21, holes are formed to be larger than the holes of the two-dimensional photonic crystal layer 12. However, since the lower mask layer 21 is removed thereafter, there is no problem.

REFERENCE SIGNS LIST 10, 10A . . . Two-Dimensional Photonic Crystal Surface Emitting Laser
11 . . . Active Layer
111 . . . Current Injection Range
12, 12A, 12B, 12C . . . Two-Dimensional Photonic Crystal Layer
121 . . . Base Body
122, 122A, 122B, 122C . . . Modified Refractive Index Region Pair
1221, 1221A, 1221B, 1221C . . . First Modified Refractive Index Region
1221BG, 1221CG, 1221C1G . . . Center of Gravity of First Modified Refractive Index Region
1221BL, 1221CL . . . Reference Axis of First Modified Refractive Index Region
1222, 1222A, 1222B, 1222C . . . Second Modified Refractive Index Region
1222BG, 1222CG, 1222C1G . . . Center of Gravity of Second Modified Refractive Index Region
1221BL, 1221CL, 1222C1L . . . Reference Axis of Second Modified Refractive Index Region
122BS, 122CS . . . Straight Line Connecting Center of Gravity of First Modified Refractive Index Region and Center of Gravity of Second Modified Refractive Index Region
13 . . . Spacer Layer
141 . . . First Cladding Layer
142 . . . Second Cladding Layer
15, 15A . . . First Electrode
16, 16A . . . Second Electrode
161A . . . Window Portion of Second Electrode
162A . . . Frame Portion of Second Electrode
21 . . . Lower Mask Layer
22 . . . First Upper Mask
221 . . . First Resist
2221 . . . First Hole
2222 . . . Second Hole
23 . . . Second Upper Mask
231 . . . Second Resist
232 . . . Hole of Second Upper Mask

The invention claimed is:

1. A two-dimensional photonic crystal surface emitting laser having, in a plate-shaped base body, a two-dimensional photonic crystal in which modified refractive index region pairs are periodically arranged and an active layer provided on one side of the base body, each of the modified refractive index region pair comprising a first modified refractive index region and a second modified refractive index region having refractive indexes different from a refractive index of the base body,
wherein an area of a planar shape of the first modified refractive index region is larger than or equal to an area of a planar shape of the second modified refractive index region, and
wherein a thickness of the first modified refractive index region is smaller than a thickness of the second modified refractive index region.

2. The two-dimensional photonic crystal surface emitting laser according to claim 1, wherein the modified refractive index region pairs are arranged in a square lattice pattern having a period length "a" in an x direction parallel to the base body and a period length "a" in a y direction parallel to the base body and perpendicular to the x direction, and wherein a center of gravity of the first modified refractive index region and a center of gravity of the second modified refractive index region are arranged to be shifted from each other by 0.15a to 0.35a in the x direction and by 0.15a to 0.35a in the y direction.

3. The two-dimensional photonic crystal surface emitting laser according to claim 2, wherein the center of gravity of the first modified refractive index region and the center of gravity of the second modified refractive index region are arranged to be shifted from each other by 0.23a to 0.28a in the x direction and by 0.23a to 0.28a in the y direction.

4. The two-dimensional photonic crystal surface emitting laser according to claim 1, wherein one or both of the first modified refractive index region and the second modified refractive index region has a circular planar shape.

5. The two-dimensional photonic crystal surface emitting laser according to claim 1, wherein one or both of the first modified refractive index region and the second modified refractive index region has a non-circular planar shape, and a reference axis is arranged so as to be in a direction within a range of 45° to 135° with respect to a straight line connecting the center of gravity of the first modified refractive index region and the center of gravity of the second modified refractive index region, the reference axis being defined by a straight line having a smaller second moment of area out of two straight lines which are perpendicular at a center of gravity in the planar shape and are determined so that a product of inertia of area is 0.

6. The two-dimensional photonic crystal surface emitting laser according to claim 5, wherein the non-circular shape is an ellipse or a rectangle.

7. The two-dimensional photonic crystal surface emitting laser according to claim 5, wherein one of the first modified refractive index region and the second modified refractive index region has the non-circular shape, and the other has a circular shape.

8. A method of manufacturing a two-dimensional photonic crystal surface emitting laser having, in a plate-shaped base body, a two-dimensional photonic crystal in which modified refractive index region pairs are periodically arranged and an active layer provided on one side of the base body, each of the modified refractive index region pairs comprising a first modified refractive index region and a second modified refractive index region having refractive indexes different from a refractive index of the base body, the method comprising:

a lower mask layer producing step of producing a lower mask layer on the base body;

a first upper mask forming step of forming, on the lower mask layer, a first upper mask in which hole pairs comprising a first hole and a second hole are provided at the same period as the modified refractive index region pairs;

a first etching step of etching the lower mask layer and the base body down to a predetermined first depth at maximum through the first hole and the second hole;

a first upper mask removing step of removing the first upper mask;

a second upper mask forming step of forming, on the lower mask layer, a second upper mask which has a hole larger than one of the first hole and the second hole provided at a position corresponding to the one and which is closed at a position corresponding to the other;

a second etching step of etching the base body down to a predetermined second depth through the hole of the second upper mask;

a second upper mask removing step of removing the second upper mask; and a lower mask layer removing step of removing the lower mask layer.

9. The method of manufacturing a two-dimensional photonic crystal surface emitting laser according to claim 8, wherein the first hole is larger in area than the second hole, and the hole of the second upper mask is provided at a position corresponding to the second hole.

10. The method of manufacturing a two-dimensional photonic crystal surface emitting laser according to claim 8, wherein areas of the first hole and the second hole are the same.

11. The two-dimensional photonic crystal surface emitting laser according to claim 2, wherein one or both of the first modified refractive index region and the second modified refractive index region has a circular planar shape.

12. The two-dimensional photonic crystal surface emitting laser according to claim 2, wherein one or both of the first modified refractive index region and the second modified refractive index region has a non-circular planar shape, and a reference axis is arranged so as to be in a direction within a range of 45° to 135° with respect to a straight line connecting the center of gravity of the first modified refractive index region and the center of gravity of the second modified refractive index region, the reference axis being defined by a straight line having a smaller second moment of area out of two straight lines which are perpendicular at a center of gravity in the planar shape and are determined so that a product of inertia of area is 0.

13. The two-dimensional photonic crystal surface emitting laser according to claim 12, wherein the non-circular shape is an ellipse or a rectangle.

14. The two-dimensional photonic crystal surface emitting laser according to claim 6, wherein one of the first modified refractive index region and the second modified refractive index region has the non-circular shape, and the other has a circular shape.

15. The two-dimensional photonic crystal surface emitting laser according to claim 12, wherein one of the first modified refractive index region and the second modified refractive index region has the non-circular shape, and the other has a circular shape.

16. The two-dimensional photonic crystal surface emitting laser according to claim 13, wherein one of the first modified refractive index region and the second modified refractive index region has the non-circular shape, and the other has a circular shape.

* * * * *